United States Patent
Imai et al.

(10) Patent No.: US 10,439,124 B2
(45) Date of Patent: Oct. 8, 2019

(54) THERMOELECTRIC CONVERSION MODULE, HEAT CONDUCTIVE LAMINATE, AND METHOD OF PRODUCING THERMOELECTRIC CONVERSION MODULE

(71) Applicant: FUJIFILM Corporation, Tokyo (JP)

(72) Inventors: Shinji Imai, Kanagawa (JP); Hideyuki Suzuki, Kanagawa (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 16/015,306

(22) Filed: Jun. 22, 2018

(65) Prior Publication Data
US 2019/0019936 A1 Jan. 17, 2019

Related U.S. Application Data

(63) Continuation of application No. PCT/JP2016/088117, filed on Dec. 21, 2016.

(30) Foreign Application Priority Data

Dec. 25, 2015 (JP) .................................. 2015-254646
May 31, 2016 (JP) .................................. 2016-108428

(51) Int. Cl.
*H01L 35/32* (2006.01)
*H02N 11/00* (2006.01)
(Continued)

(52) U.S. Cl.
CPC .............. *H01L 35/32* (2013.01); *H02N 11/00* (2013.01); *H01L 35/16* (2013.01); *H01L 35/18* (2013.01); *H01L 35/22* (2013.01); *H01L 35/34* (2013.01)

(58) Field of Classification Search
CPC ......... H01L 35/16; H01L 35/18; H01L 35/32; H01L 35/34; H01L 35/22
See application file for complete search history.

(56) References Cited

U.S. PATENT DOCUMENTS 2,607,104 A * 8/1952 Foster ..................... B29C 61/02
428/101
2,694,098 A * 11/1954 Leins ..................... H01L 35/32
136/201
(Continued)

FOREIGN PATENT DOCUMENTS

JP 5-168846 A 7/1993
JP 6-151979 A 5/1994
(Continued)

OTHER PUBLICATIONS

International Search Report for PCT/JP2016/088117 dated Jan. 31, 2017 [PCT/ISA/210].
(Continued)

*Primary Examiner* — Golam Mowla
(74) *Attorney, Agent, or Firm* — Sughrue Mion, PLLC

(57) ABSTRACT

An object of the present invention is to provide a thermoelectric conversion module which is obtained by combining an insulating member, a heat dissipation member, or the like with a bellows-like thermoelectric conversion module and has good structural stability and handleability and good flexibility, a heat conductive laminate used for the thermoelectric conversion module, and methods of producing the same. The object is achieved by providing a thermoelectric conversion module including a module main body having a bellows-like support, thermoelectric conversion layers formed on the support and are separated from each other, connection electrodes which connect the thermoelectric conversion layers adjacent to each other; one or more bellows-like members provided such that concave and convex por- (Continued)

tions thereof are fitted to those of the module main body; and a flexible linear member which penetrates sloped surfaces of a bellows of the module main body and sloped surfaces of a bellows of one or more bellows-like members so as to be inserted through the module main body and the one or more bellows-like members.

15 Claims, 9 Drawing Sheets

(51) Int. Cl.
*H01L 35/34* (2006.01)
*H01L 35/16* (2006.01)
*H01L 35/18* (2006.01)
*H01L 35/22* (2006.01)

(56) References Cited

U.S. PATENT DOCUMENTS

| 3,539,399 | A | * | 11/1970 | Harvey | H01L 35/06 |
| | | | | | 100/269.03 |
| 3,694,995 | A | * | 10/1972 | McKinney | B32B 27/00 |
| | | | | | 53/442 |
| 4,859,250 | A | * | 8/1989 | Buist | F25B 21/02 |
| | | | | | 136/225 |
| 5,279,128 | A | | 1/1994 | Tomatsu et al. | |
| 7,851,691 | B2 | * | 12/2010 | DeSteese | H01L 35/08 |
| | | | | | 136/201 |
| 8,378,205 | B2 | * | 2/2013 | Sienel | H01L 35/30 |
| | | | | | 136/200 |
| 2009/0014046 | A1 | * | 1/2009 | Yu | H01L 35/32 |
| | | | | | 136/200 |
| 2011/0220162 | A1 | | 9/2011 | Siivola et al. | |
| 2014/0318591 | A1 | | 10/2014 | Shelby et al. | |

FOREIGN PATENT DOCUMENTS

| JP | 2003-315163 A | 11/2003 |
| JP | 2003-318456 A | 11/2003 |
| JP | 2005-328000 A | 11/2005 |
| JP | 2008-130813 A | 6/2008 |
| JP | 2008-205129 A | 9/2008 |
| WO | 2013/114854 A1 | 8/2013 |
| WO | 2014/176084 A1 | 10/2014 |

OTHER PUBLICATIONS

International Preliminary Report on Patentability with the translation of Written Opinion dated Jun. 26, 2018 in No. PCT/JP2016/088117.

* cited by examiner

THERMOELECTRIC CONVERSION MODULE, HEAT CONDUCTIVE LAMINATE, AND METHOD OF PRODUCING THERMOELECTRIC CONVERSION MODULE

CROSS-REFERENCE TO RELATED APPLICATIONS

This application is a Continuation of PCT International Application No. PCT/JP2016/088117 filed on Dec. 21, 2016, which claims priority under 35 U.S.C. § 119(a) to Japanese Patent Application No. 2015-254646 filed on Dec. 25, 2015 and Japanese Patent Application No. 2016-108428 filed on May 31, 2016. Each of the above applications is hereby expressly incorporated by reference, in its entirety, into the present application.

BACKGROUND OF THE INVENTION

1. Field of the Invention

The present invention relates to a thermoelectric conversion module having good productivity, a method of producing the thermoelectric conversion module, and a heat conductive laminate used for a thermoelectric conversion module or the like.

2. Description of the Related Art

Thermoelectric conversion materials capable of converting heat energy to electrical energy and vice versa are used in thermoelectric conversion elements such as power generation elements or Peltier elements which generate power using heat.

Thermoelectric conversion elements are capable of directly converting heat energy to electric power and, advantageously, do not require any movable portions. Therefore, thermoelectric conversion modules (power generation devices) obtained by connecting a plurality of thermoelectric conversion elements are capable of easily obtaining electric power without the need of operation costs by being provided in, for example, heat discharging portions of incineration furnaces, various facilities in plants, and the like.

Thermoelectric conversion elements are normally used for a thermoelectric conversion module formed by connecting a plurality of thermoelectric conversion elements in series. As a thermoelectric conversion module, a so-called π-type thermoelectric conversion module using a thermoelectric conversion material such as Bi—Te has been known.

For example, a π-type thermoelectric conversion module is prepared by processing P-type and N-type thermoelectric conversion materials into a block shape, alternately arranging the thermoelectric conversion materials on a substrate of ceramic or the like, and connecting the arranged thermoelectric conversion materials in series.

For such a π-type thermoelectric conversion module, labor for processing of thermoelectric conversion materials into a block shape, arrangement of thermoelectric conversion materials, connection of the thermoelectric conversion materials by electrodes, and the like is required.

In contrast, a thermoelectric conversion module having a thermoelectric conversion layer and an electrode formed on an insulating support (substrate) having flexibility, such as a resin film, by a coating method such as printing or a vacuum film formation method such as vacuum vapor deposition has been reported.

For example, JP2005-328000A discloses a thermoelectric conversion module including an insulating sheet having flexibility, in which a plurality of top portions projecting to a surface side and a plurality of bottom portions projecting to a rear surface side are formed by folding the insulating sheet in a bellows-like (waveform) shape, and a thermocouple having a first contact and a second contact provided on the insulating sheet, in which the first contact is arranged at a top portion adjacent portion which is adjacent to the top portion, and the second contact is arranged at a bottom portion adjacent portion which is adjacent to the bottom portion.

In addition, WO2013/114854A discloses a thermoelectric conversion module including a flexible base material folded in a bellows-like shape (waveform structure) in which bottom portions and top portions are alternately repeated, a first thermoelectric conversion layer formed on the base material along a first sloped surface between the top portion and a first bottom portion connected to the top portion, and a second thermoelectric conversion layer formed along a second sloped surface between the top portion and a second bottom portion connected to the top portion, in which the first thermoelectric conversion layer and the second thermoelectric conversion layer have the same shape, the first thermoelectric conversion layer and the second thermoelectric conversion layer have contact points to wiring on the top portion side and the first bottom portion side and on the top portion side and the second bottom portion side, respectively.

In such thermoelectric conversion modules using a resin film or the like as a support, the thermoelectric conversion layers and electrodes can be formed by a coating method using an ink-like thermoelectric conversion material or electrode material, a vacuum film formation method such as vacuum vapor deposition of a thermoelectric conversion material and an electrode material, and the like.

Therefore, this thermoelectric conversion module can be easily produced and the production cost can be reduced compared to a π-type thermoelectric conversion module using a block-shaped thermoelectric conversion material.

In addition, because an electromotive force of one thermoelectric conversion element is very small, it is necessary for a thermoelectric conversion module to increase the voltage and the power generation capacity by connecting several hundreds or more of thermoelectric conversion elements in series. In contrast, the thermoelectric conversion module using a resin film or the like as a support can easily cope with the formation of a plurality of thermoelectric conversion elements by production using printing or the like.

SUMMARY OF THE INVENTION

As a method of improving the performance of a bellows-like thermoelectric conversion module having flexibility such as power generation capacity, various methods can be considered.

For example, as disclosed in JP2005-328000A and WO2013/114854A, the thermoelectric conversion module of the related art having a bellows-like folded shape is formed in a state in which a bellows-like sloped surface on which a thermoelectric conversion layer and the like are formed is separated from a facing sloped surface.

However, in such a bellows-like thermoelectric conversion module, it is advantageous to compress a support that is folded in a bellows-like shape in the arrangement direction of a thermoelectric conversion layer to close the bellow as much as possible from the viewpoint of reducing the size, improving heat transfer efficiency, improving the mounting density of a thermoelectric conversion element, and the like.

However, in a case where the bellows is closed in the bellows-like thermoelectric conversion module of the related art, the electrodes come into contact with each other to cause a short circuit. Thus, power is not generated at all. Therefore, it is considered that an insulating member is combined with the bellows-like thermoelectric conversion module.

In addition, it is known that power generation capacity can be improved in a thermoelectric conversion module by increasing a temperature difference between thermoelectric conversion layers by using a heat dissipation fin or the like together.

Accordingly, for the purpose of improving power generation capacity, it is considered that a heat dissipation member such as a heat dissipation fin is combined with a bellows-like thermoelectric conversion module.

In a case where an insulating member or a heat dissipation member is combined with a bellows-like thermoelectric conversion module as described above, it is required that the configuration can be stably maintained without separation between the thermoelectric conversion module and the member and good handleability is exhibited.

In addition, it is considered that a bellows-like thermoelectric conversion module having flexibility is mounted on a curved surface of a cylindrical tube or the like by utilizing the flexibility. Accordingly, it is preferable that a thermoelectric conversion module has flexibility even in a case where an insulating member or a heat dissipation member is combined with the bellows-like thermoelectric conversion module.

However, currently, a thermoelectric conversion module which is obtained by combining an insulating member, a heat dissipation member, or the like with such a bellows-like thermoelectric conversion module having flexibility and has a good structural stability, handleability, flexibility, and the like by has not been known.

An object of the present invention is to solve the problems of the related art and to provide a thermoelectric conversion module which is obtained by combining an insulating member, a heat dissipation member, or the like with a bellows-like thermoelectric conversion module having flexibility and has good structural stability and handleability and good flexibility, a heat conductive laminate used for the thermoelectric conversion module, and methods of producing the same.

In order to achieve the object, there is provided a thermoelectric conversion module of the present invention comprising:
a module main body having a support which is folded in a bellows-like shape, a plurality of thermoelectric conversion layers which are formed on at least one surface of the support and are separated from each other, and connection electrodes which connect the thermoelectric conversion layers adjacent to each other;
one or more bellows-like members which are provided such that concave and convex portions thereof are fitted to those of the module main body and are folded in a bellows-like shape; and
a flexible linear member which penetrates sloped surfaces of the module main body formed by bellows-like folding and sloped surfaces of at least one of the bellows-like members formed by bellows-like folding so as to be inserted through the module main body and at least one of the bellows-like members.

In the thermoelectric conversion module of the present invention, it is preferable that bellows-like member is one or more selected from an insulating member, a heat dissipation member, and a thermoelectric conversion member.

It is preferable that the insulating member is provided to face a surface of the module main body on which the thermoelectric conversion layer is formed.

It is preferable that the heat dissipation member is provided to face a surface of the insulating member on a side opposite to the module main body.

It is preferable that the thermoelectric conversion module further comprises a second flexible linear member which penetrates sloped surfaces of the insulating member and sloped surfaces of the heat dissipation member so as to be inserted through the insulating member and the heat dissipation member.

It is preferable that the insulating member has a heat conductive layer on a surface of an insulating layer, and the insulating layer is provided to face a surface of the module main body on which the thermoelectric conversion layer is formed.

It is preferable that the thermoelectric conversion member has a member support which is folded in a bellows-like shape, a plurality of member thermoelectric conversion layers which are formed on at least one surface of the member support and are separated from each other, and member connection electrodes which connect the member thermoelectric conversion layers adjacent to each other.

In addition, it is preferable that the module main body has the thermoelectric conversion layers on only one surface of the support, the thermoelectric conversion member has the member thermoelectric conversion layers on only one surface of the member support, and at least one of a thermoelectric conversion member which is provided to face the member support or a thermoelectric conversion member which is provided to face the member thermoelectric conversion layer is provided on the thermoelectric conversion layer of the module main body or on the support of the module main body.

It is preferable that a plurality of the thermoelectric conversion members are provided, and one or more combinations of the thermoelectric conversion members which are provided to face the member support and the member thermoelectric conversion layer are provided.

It is preferable that the linear member penetrates locations other than positions where the thermoelectric conversion layers are formed and positions where the connection electrodes are formed in the module main body.

It is preferable that the linear member penetrates the connection electrodes at the same position in a slope direction of the sloped surface and on an outer side of a ridge line in a longitudinal direction.

It is preferable that the thermoelectric conversion layers of the module main body are P-type thermoelectric conversion layers and N-type thermoelectric conversion layers which are alternately provided on each sloped surface of one surface of the support.

In addition, there is provided a heat conductive laminate of the present invention comprising:
an insulating member which is folded in a bellows-like shape;
a heat dissipation member which is folded in a bellows-like shape and is provided such that concave and convex portions thereof are fitted to those of the insulating member; and
a flexible linear member which penetrates sloped surfaces of the insulating member formed by bellows-like folding, sloped surfaces of the heat dissipation member formed by bellows-like folding so as to be inserted through the insulating member and the heat dissipation member.

In the heat conductive laminate of the present invention, it is preferable that the insulating member has a heat conductive layer on a surface of an insulating layer.

There is provided a first aspect of a method of producing a thermoelectric conversion module of the present invention comprising:

a step of preparing a module main body having a support which is folded in a bellows-like shape, a plurality of thermoelectric conversion layers which are formed on at least one surface of the support and are separated from each other, connection electrodes which connect the thermoelectric conversion layers adjacent to each other, and a flexible linear member which penetrates sloped surfaces formed by the bellows-like folding so as to be inserted through a bellows;

a step of preparing a bellows-like member which is folded in a bellows-like shape and has a flexible linear member which penetrates sloped surfaces formed by the bellows-like folding so as to be inserted through a bellows;

a step of, while transporting the module main body and the bellows-like member in a direction orthogonal to a ridge line formed by the bellows-like folding, laminating the module main body and the bellows-like member such that concave and convex portions thereof are fitted to each other in a transport path changing portion provided in a transport path; and a step of providing a flexible linear fixing member which penetrates sloped surfaces of the module main body and sloped surfaces of the bellows-like member so as to be inserted through the laminated module main body and bellows-like member.

In the first aspect of the method of producing a thermoelectric conversion module according to the present invention, it is preferable that the linear fixing member is at least one of a linear member which is inserted through the module main body or a linear member which is inserted through the bellows-like member, and in the step of inserting the linear fixing member, a step of drawing out the linear member from the laminated module main body and bellows-like member, a step of aligning the module main body and the bellows-like member, and a step of inserting at least one of a linear member drawn out from the module main body or a linear member drawn out from the bellows-like member through a through-hole on a sloped surface from which the linear member is drawn out are performed.

It is preferable that in the step of inserting the linear fixing member, in a state in which a linear member which is inserted through the module main body and a linear member which is inserted through the bellows-like member are left as they are, the linear fixing member is inserted through the module main body and the bellows-like member.

It is preferable that the bellows-like member is one or more selected from an insulating member, a heat dissipation member, and a thermoelectric conversion member.

In addition, it is preferable that the insulating member and the heat dissipation member are laminated such that concave and convex portions thereof are fitted to each other, and a flexible linear member which penetrates sloped surfaces of the insulating member and sloped surfaces of the heat dissipation member so as to be inserted through the insulating member and the heat dissipation member is provided.

Further, it is preferable that the insulating member has a heat conductive layer on a surface of an insulating layer.

In addition, there is provided a second aspect of a method of producing a thermoelectric conversion module of the present invention comprising:

a step of laminating a plurality of sheet-like materials each having a support, a plurality of thermoelectric conversion layers which are formed on at least one surface of the support and are separated from each other, and connection electrodes which connect the thermoelectric conversion layers adjacent to each other;

a step of folding a laminate of the sheet-like materials in a bellows-like shape; and a step of causing a flexible linear member to penetrate sloped surfaces of the bellows-like folded sheet-like material formed by bellows-like folding so as to be inserted through the sheet-like material.

Further, there is provided a method of producing a heat conductive laminate of the present invention comprising:

a step of preparing an insulating member which is folded in a bellows-like shape and has a flexible linear member which penetrates sloped surfaces formed by the bellows-like folding so as to be inserted through a bellows;

a step of preparing a heat dissipation member which is folded in a bellows-like shape and has a flexible linear member which penetrates sloped surfaces formed by the bellows-like folding so as to be inserted through a bellows;

a step of, while transporting the insulating member and the heat dissipation member in a direction orthogonal to a ridge line formed by bellows-like folding, laminating the insulating member and the heat dissipation member such that concave and convex portions thereof are fitted to each other in a transport path changing portion provided in a transport path; and a step of causing a flexible linear fixing member to penetrate sloped surfaces of the laminated insulating member and heat dissipation member so as to be inserted through the insulating member and the heat dissipation member.

In the method of producing a heat conductive laminate of the present invention, it is preferable that the linear fixing member is at least one of a linear member which is inserted through the sloped surfaces of the insulating member or a linear member which is inserted through the sloped surfaces of the heat dissipation member, and in the step of causing the linear fixing member to penetrate, a step of drawing out the linear member from the laminated insulating member and heat dissipation member, a step of aligning the insulating member and the heat dissipation member, and a step of inserting at least one of the linear member which is drawn out from the insulating member or the linear member which is drawn out from the heat dissipation member through a through-hole on a sloped surface from which the linear member is drawn out are performed.

In addition, it is preferable that in the step of causing the linear fixing member to penetrate, in a state in which the linear member inserted through the insulating member and the linear member inserted through the heat dissipation member are left as they are, the linear fixing member is inserted through the insulating member and the heat dissipation member.

Further, it is preferable that the insulating member has a heat conductive layer on a surface of an insulating layer.

According to the present invention, it is possible to obtain a thermoelectric conversion module which is obtained by combining an insulating member, a heat dissipation member, or the like with a bellows-like thermoelectric conversion module having flexibility and has good structural stability and handleability and good flexibility.

DESCRIPTION OF THE PREFERRED EMBODIMENTS

Hereinafter, a thermoelectric conversion module, a heat conductive laminate, a method of producing a thermoelectric conversion module, and a method of producing a heat conductive laminate of the present invention will be described in detail based on preferable embodiments shown in the accompanying drawings.

In the present specification, a numerical range represented by using "to" indicates a range including the numerical values before and after "to" as the lower limit and the upper limit.

Figure 1A:
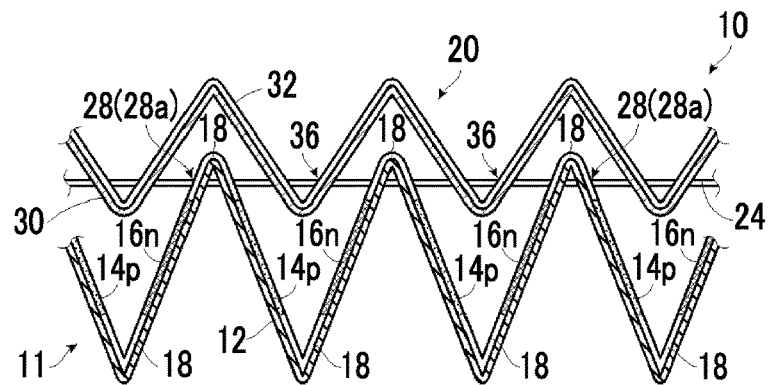
FIG. 1A is a schematic front view showing an example of a thermoelectric conversion module according to the present invention.
Figure 1B:
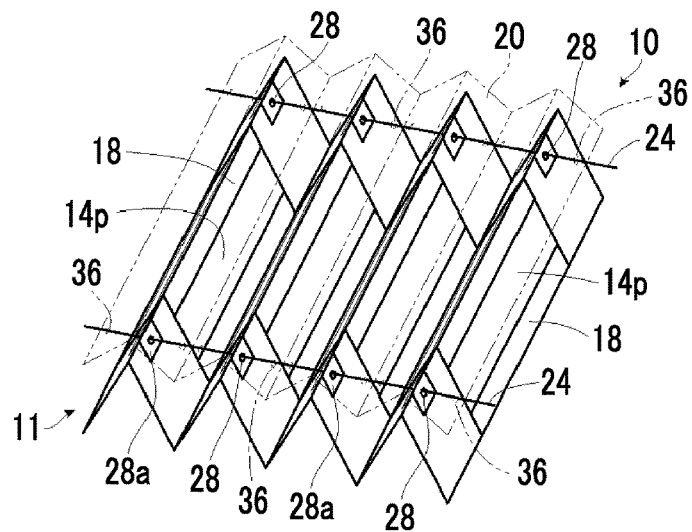
FIG. 1B is a schematic perspective view showing the thermoelectric conversion module shown in FIG. 1A.
Figure 1C:
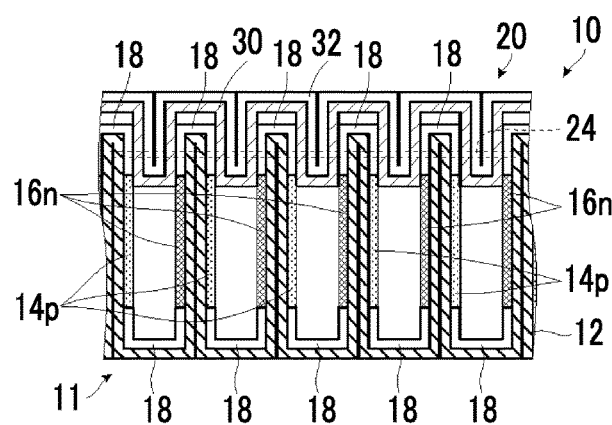
FIG. 1C is a schematic front view showing a state in which a bellows of the thermoelectric conversion module shown in FIG. 1A is closed.

FIGS. 1A to 1C show conceptually an example of a thermoelectric conversion module according to the present invention.

FIG. 1A is a schematic front view, FIG. 1B is a schematic perspective view, and FIG. 1C is a schematic front view showing a state in which a bellows of a thermoelectric conversion module 10 is closed.

The term "front view" is a view the thermoelectric conversion module 10 of the present invention as seen from a plane direction of a module main body 11.

In addition, in FIG. 1C, a bellows-like folded portion is shown in a rectangular shape so that the configuration and each member of the thermoelectric conversion module 10 are clearly shown. However, in the thermoelectric conversion module 10 of the present invention, a state in which a bellows is closed is a state in which the thermoelectric conversion module 10 shown in FIG. 1A is compressed in a horizontal direction in the drawing. Accordingly, in a state in which the bellows of the thermoelectric conversion module 10 is closed, mountain-folded or valley-folded portions which will be described later are formed at an acute angle. Regarding this point, the same applies to FIG. 4B which will be described later.

As shown in FIGS. 1A to 1C, the thermoelectric conversion module 10 of the present invention include a module main body 11, an insulating member 20, and a wire 24. In FIG. 1B, in order to clearly show the configuration, the insulating member 20 is indicated by a two-dot dashed line.

The thermoelectric conversion module 10 has a configuration in which the module main body 11 which is folded in a bellows-like shape and the insulating member 20 which is folded in a bellows-like shape are laminated such that concave and convex portions thereof are fitted to those of the module main body, and the wire 24 is inserted through both the module main body 11 and the bellows-like insulating member 20. In the following description, the term "thermoelectric conversion module 10" is also referred to as "module 10".

In the present invention, the term "laminate" indicates a state in which concave and convex portions of the bellows, that is, mountain fold portions and valley fold portions of the bellows are fitted to each other, and the convex portions of the module main body and the insulating member are inserted through the concave portions while the largest surfaces face each other, and includes not only a state in which the facing surfaces of the bellows to be laminated wholly come into contact with each other, but also a state in which the facing surfaces of the bellows to be laminated are partially or wholly separated from each other and held.

Accordingly, in the example shown in FIG. 1A, the module main body 11 and the insulating member 20 are wholly separated from each other. However, for example, in a state in which the module main body and the insulating member are laminated, at the top portions of convex portions of the module main body 11 and the insulating member 20 toward the upper side in the drawing, the facing surfaces may come into contact with each other. Alternatively, in a state in which the module main body 11 and the insulating member 20 are laminated, the entire surface of the insulating member 20 may come into contact with the facing surface of the module main body 11.

Figure 2:
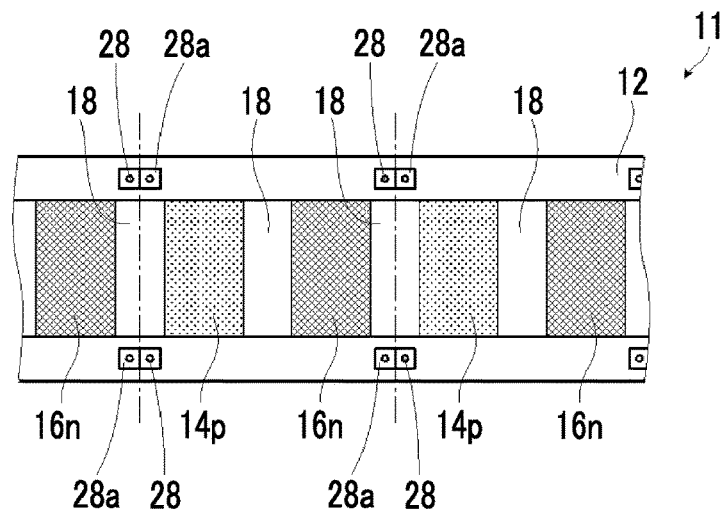
FIG. 2 is a conceptual view for illustrating the thermoelectric conversion module shown in FIGS. 1A to 1C.

FIG. 2 shows a conceptual view in which the module main body 11 is spread in a plane shape.

As shown in FIGS. 1A and 2, the module main body 11 has a support 12, P-type thermoelectric conversion layers 14$p$, N-type thermoelectric conversion layers 16$n$, and connection electrodes 18.

Figure 10:
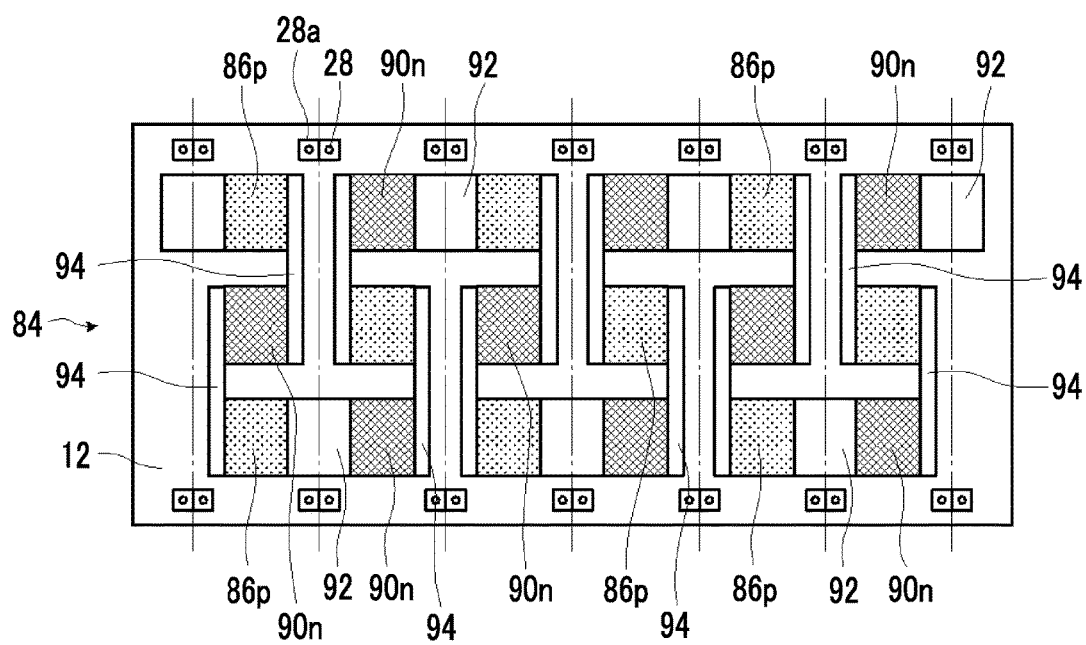
FIG. 10 is a conceptual view for illustrating still another example of the thermoelectric conversion module according to the present invention.
Figure 11:
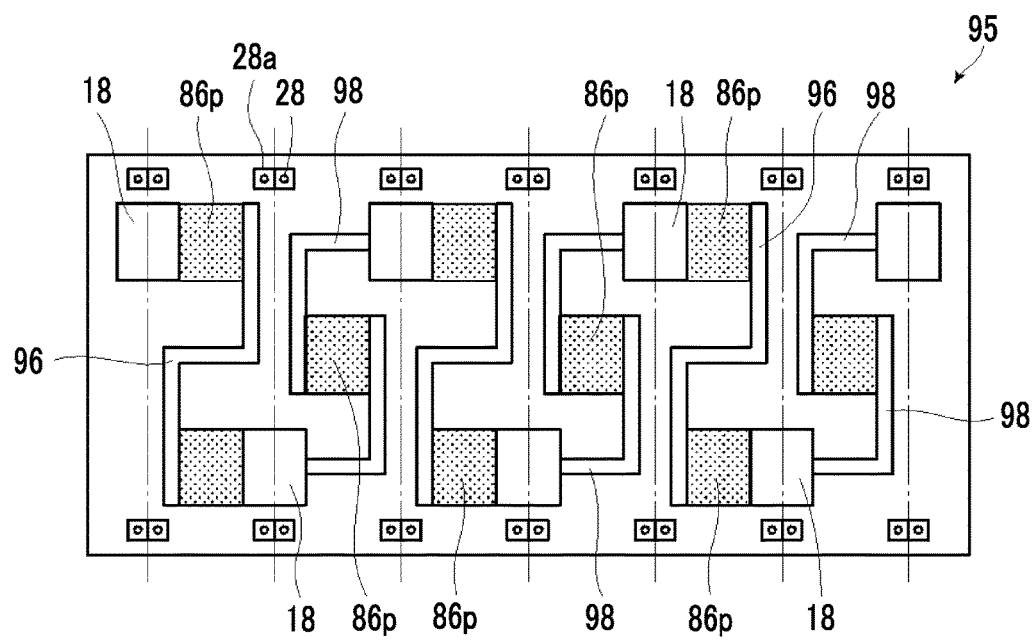
FIG. 11 is a conceptual view for illustrating still another example of the thermoelectric conversion module according to the present invention.

In FIGS. 1A and 1C, in order to clearly show the configuration, a diagonal line is attached to the support 12, and a half-tone dot meshing pattern is attached to the P-type thermoelectric conversion layer 14$p$ and the N-type thermoelectric conversion layer 16$n$. Regarding the half-tone dot meshing pattern of the P-type thermoelectric conversion layer 14$p$ and the N-type thermoelectric conversion layer 16$n$, the same applies to FIG. 2 (FIGS. 10 and 11 which will be described later).

As shown in FIG. 2, in the module main body 11, the connection electrodes 18 having a fixed length are formed on one surface of the long support 12 at fixed intervals in the longitudinal direction of the support 12, and the P-type thermoelectric conversion layers 14$p$ and the N-type thermoelectric conversion layers 16$n$ having a fixed length are alternately formed on the same surface of the support 12 in the longitudinal direction of the support 12 with fixed intervals.

In the following description, the term "the longitudinal direction of the support 12" also referred to as "longitudinal direction". In addition, in the following description, a width direction of the support 12, that is, a direction orthogonal to the longitudinal direction is also referred to as "width direction". Accordingly, the width direction is a direction perpendicular to the paper plane in FIGS. 1A and 1C.

In the present invention, the length or interval in the longitudinal direction refers to a length or interval in a state in which the module main body 11 is spread in a plane shape.

The module main body 11 is formed in a bellows-like shape by being alternately mountain-folded and valley-folded along folding lines parallel in the width direction of the support 12 at the center of the connection electrode 18 in the longitudinal direction. Accordingly, the module main body 11 alternately has a mountain fold portion and a valley fold portion in the longitudinal direction by bellows-like folding and alternately has the top portion and the bottom portion. Accordingly, the longitudinal direction is matched with the slope direction of the sloped surface formed by bellows-like folding.

In the example, a side where the support 12 becomes an inner side by folding the support in a bellows-like shape, that is, the connection electrode 18 projects is a mountain fold, and a side where the support 12 becomes an outer side by folding the support, that is, the connection electrode 18 is concave is a valley fold. That is, the upper side in the drawing of FIG. 1A is the mountain fold side and the lower side of the drawing is the valley fold side.

In the module main body 11, the P-type thermoelectric conversion layer 14$p$ and the N-type thermoelectric conversion layer 16$n$ are alternately arranged to be separated from each other in the longitudinal direction and the P-type thermoelectric conversion layer 14$p$ and the N-type thermoelectric conversion layer 16$n$ which are adjacent to each other in the longitudinal direction are connected in series by the connection electrode 18.

In addition, as described above, the module main body 11 is mountain-folded and valley-folded at the center of the connection electrode 18 in the longitudinal direction and is formed in a bellows-like shape.

Such a module main body 11 generates power by, for example, providing a high temperature heat source on the lower side in FIG. 1A and heat dissipation means such as a heat dissipation fin on the upper side, and causing a temperature difference in the vertical direction in FIG. 1A. In other words, power generation is performed with respect to the P-type thermoelectric conversion layer 14$p$ and the N-type thermoelectric conversion layer 16$n$ formed on the sloped surfaces of the support 12 by causing a temperature difference between the thermoelectric conversion layers in the longitudinal direction.

The support (substrate) 12 is long and has flexibility and insulating properties.

In the module of the present invention, various long sheet-like materials (films) used in known thermoelectric conversion modules using a flexible support can be used for the support 12 as long as the material has flexibility and insulating properties.

Specific examples thereof include sheet-like materials of polyester resins such as polyethylene terephthalate, polyethylene isophthalate, polyethylene naphthalate, polybutylene terephthalate, poly(1,4-cyclohexylene dimethylene terephthalate), and polyethylene-2,6-naphthalenedicarboxylate, resins such as polyimide, polycarbonate, polypropylene, polyethersulfone, cycloolefin polymer, polyether ether ketone (PEEK), and triacetyl cellulose (TAC), glass epoxy, and liquid crystal polyester.

Among these, from the viewpoint of thermal conductivity, heat resistance, solvent resistance, ease of availability, and economy, sheet-like materials of polyimide, polyethylene terephthalate, polyethylene naphthalate, and the like are suitably used.

Regarding the thickness of the support 12, a thickness which provides sufficient flexibility and functions as the support 12 may be appropriately set according to the material for forming the support 12, and the like.

The length and width of the support 12 may be appropriately set according to the size and use of the module main body 11 or the like.

Through-holes 28 are formed on the sloped surfaces formed by folding the vicinities of both end portions of the support 12 in the width direction. Specifically, as a preferable embodiment, in the width direction, the through-hole 28 is positioned on the outer side of a region in which the P-type thermoelectric conversion layer 14p, the N-type thermoelectric conversion layer 16n, and the connection electrode 18 are formed on the support 12 in the width direction. In addition, a pair of through-holes 28 is formed at the same position as the connection electrode 18 to be mountain-folded at the center of the connection electrode 18 in the longitudinal direction, that is, at the position symmetrical with the folding line of the mountain fold indicated by a dashed line in FIG. 2, in the longitudinal direction. As described above, the longitudinal direction and the slope direction of the sloped surface are the same direction.

Further, the through-holes 28 are preferably formed at positions which are linearly aligned in the longitudinal direction in a case where the support 12 is folded in a bellows-like shape. That is, the through-holes 28 are preferably formed at positions where one long straight line can be inserted in the longitudinal direction in a case where the support 12 is folded in a bellows-like shape.

Although described later, the wire 24 penetrates the through-holes 28 and is inserted through the module main body 11 and the insulating member 20.

Reference numeral 28a refers to a reinforcing member for reinforcing the through-hole 28, which is provided if necessary. The reinforcing member 28a may be formed by using a known hole reinforcing member of, for example, metals and resin materials.

On one surface of the support 12, the P-type thermoelectric conversion layers 14p and the N-type thermoelectric conversion layers 16n having a fixed length are alternately provided at fixed intervals in the longitudinal direction.

In the following description, in a case where there is no need to distinguish the P-type thermoelectric conversion layer 14p and the N-type thermoelectric conversion layer 16n, both thermoelectric conversion layers are also collectively referred to as "thermoelectric conversion layer".

In the module main body 11 of the present invention, for the P-type thermoelectric conversion layer 14p and the N-type thermoelectric conversion layer 16n, various thermoelectric conversion layers formed of known thermoelectric conversion materials can be used.

As the thermoelectric conversion material constituting the P-type thermoelectric conversion layer 14p and the N-type thermoelectric conversion layer 16n, for example, nickel or a nickel alloy may be used.

As the nickel alloy, various nickel alloys that generate power by causing a temperature difference can be used. Specific examples thereof include nickel alloys mixed with one or two or more of vanadium, chromium, silicon, aluminum, titanium, molybdenum, manganese, zinc, tin, copper, cobalt, iron, magnesium, and zirconium.

In a case where nickel or a nickel alloy is used for the P-type thermoelectric conversion layer 14p and the N-type thermoelectric conversion layer 16n, the nickel content in the P-type thermoelectric conversion layer 14p and the N-type thermoelectric conversion layer 16n is preferably 90% by atom or more and more preferably 95% by atom or more, and the P-type thermoelectric conversion layer 14p and the N-type thermoelectric conversion layer 16n are particularly preferably formed of nickel. The P-type thermoelectric conversion layer 14p and the N-type thermoelectric conversion layer 16n formed of nickel include inevitable impurities.

In a case where a nickel alloy is used as the thermoelectric conversion material for the P-type thermoelectric conversion layer 14p, chromel having nickel and chromium as main components is typically used. In a case where a nickel alloy is used as the thermoelectric conversion material for the N-type thermoelectric conversion layer 16n, constantan having copper and nickel as main components is typically used.

In addition, in a case where nickel or a nickel alloy is used for the P-type thermoelectric conversion layer 14p and the N-type thermoelectric conversion layer 16n and also nickel or a nickel alloy is used for the connection electrode 18, the P-type thermoelectric conversion layer 14p, the N-type thermoelectric conversion layer 16n, the connection electrode 18 may be integrally formed.

As other thermoelectric conversion materials that can be used for the P-type thermoelectric conversion layer 14p and the N-type thermoelectric conversion layer 16n, in addition to nickel and nickel alloys, for example, the following materials may be used. Incidentally, the components in parentheses indicate the material composition.

Examples of the materials include BiTe-based materials (BiTe, SbTe, BiSe and compounds thereof), PbTe-based materials (PbTe, SnTe, AgSbTe, GeTe and compounds thereof), Si—Ge-based materials (Si, Ge, SiGe), silicide-based materials (FeSi, MnSi, CrSi), skutterudite-based materials (compounds represented by $MX_3$ or $RM_4X_{12}$, where M equals Co, Rh, or Ir, X equals As, P, or Sb, and R equals La, Yb, or Ce), transition metal oxides (NaCoO, CaCoO, ZnInO, SrTiO, BiSrCoO, PbSrCoO, CaBiCoO, BaBiCoO), zinc antimony-based compounds (ZnSb), boron compounds (CeB, BaB, SrB, CaB, MgB, VB, NiB, CuB, LiB), cluster solids (B cluster, Si cluster, C cluster, AlRe, AlReSi), and zinc oxides (ZnO).

In addition, for the thermoelectric conversion material used for the P-type thermoelectric conversion layer 14p and the N-type thermoelectric conversion layer 16n, materials that can be made into paste can be used so that a film can be formed by coating or printing.

Specific examples of such thermoelectric conversion materials include organic thermoelectric conversion materials such as a conductive polymer and a conductive nano-carbon material.

Examples of the conductive polymer include a polymer compound having a conjugated molecular structure (conjugated polymer). Specific examples thereof include known π-conjugated polymers such as polyaniline, polyphenylene vinylene, polypyrrole, polythiophene, polyfluorene, acetylene, and polyphenylene. Particularly, polydioxythiophene can be suitably used.

Specific examples of the conductive nanocarbon material include carbon nanotubes, carbon nanofiber, graphite, graphene, and carbon nanoparticles. These may be used singly or in combination of two or more thereof. Among these, from the viewpoint of further improving thermoelectric conversion properties, carbon nanotubes are preferably used. In the following description, the term "carbon nanotubes" is also referred to as CNTs.

CNT is categorized into single layer CNT of one carbon film (graphene sheet) wound in the form of a cylinder, double layer CNT of two graphene sheets wound in the form of concentric circles, and multilayer CNT of a plurality of graphene sheets wound in the form of concentric circles. In the present invention, each of the single layer CNT, the double layer CNT, and the multilayer CNT may be used singly, or two or more thereof may be used in combination. Particularly, the single layer CNT and the double layer CNT excellent in conductivity and semiconductor characteristics are preferably used, and the single layer CNT is more preferably used.

The single layer CNT may be semiconductive or metallic. Furthermore, semiconductive CNT and metallic CNT may be used in combination. In a case where both of the semiconductive CNT and the metallic CNT are used, a content ratio between the CNTs can be appropriately adjusted. In addition, CNT may contain a metal or the like, and CNT containing fullerene molecules and the like may be used.

An average length of CNT is not particularly limited and can be appropriately selected. Specifically, from the viewpoint of ease of manufacturing, film formability, conductivity, and the like, the average length of CNT is preferably 0.01 to 2,000 µm, more preferably 0.1 to 1,000 µm, and particularly preferably 1 to 1,000 µm, though the average length also depends on an inter-electrode distance.

A diameter of CNT is not particularly limited. From the viewpoint of durability, transparency, film formability, conductivity, and the like, the diameter is preferably 0.4 to 100 nm, more preferably 50 nm or less, and particularly preferably 15 nm or less. Particularly, in a case where the single layer CNT is used, the diameter of CNT is preferably 0.5 to 2.2 nm, more preferably 1.0 to 2.2 nm, and particularly preferably 1.5 to 2.0 nm.

The CNT contains defective CNT in some cases. Because the defectiveness of the CNT deteriorates the conductivity of the thermoelectric conversion layer, it is preferable to reduce the amount of the defective CNT. The amount of defectiveness of the CNT can be estimated by a G/D ratio between a G band and a D band in a Raman spectrum. In a case where the G/D ratio is high, a material can be assumed to be a CNT material with a small amount of defectiveness. The G/D ratio is preferably 10 or higher and more preferably 30 or higher.

In addition, modified or treated CNT can also be used. Examples of the modification or treatment method include a method of incorporating a ferrocene derivative or nitrogen-substituted fullerene (azafullerene) into CNT, a method of doping CNT with an alkali metal (potassium or the like) or a metallic element (indium or the like) by an ion doping method, and a method of heating CNT in a vacuum.

In a case where CNT is used, in addition to the single layer CNT or the multilayer CNT, nanocarbons such as carbon nanohorns, carbon nanocoils, carbon nanobeads, graphite, graphene, amorphous carbon, and the like may be contained in the composition.

In a case where CNT is used for the P-type thermoelectric conversion layer 14$p$ and the N-type thermoelectric conversion layer 16$n$, it is preferable that the thermoelectric conversion layers include a P-type dopant or an N-type dopant.

(P-Type Dopant)

Examples of the P-type dopant include halogen (iodine, bromine, or the like), Lewis acid ($PF_5$, $AsF_5$, or the like), protonic acid (hydrochloric acid, sulfuric acid, or the like), transition metal halide ($FeCl_3$, $SnCl_4$, or the like), a metal oxide (molybdenum oxide, vanadium oxide, or the like), and an organic electron-accepting material. Examples of the organic electron-accepting material suitably include a tetracyanoquinodimethane (TCNQ) derivative such as 2,3,5,6-tetrafluoro-7,7,8,8-tetracyanoquinodimethane, 2,5-dimethyl-7,7,8,8-tetracyanoquinodimethane, 2-fluoro-7,7,8,8-tetracyanoquinodimethane, or 2,5-difluoro-7,7,8,8-tetracyanoquinodimethane, a benzoquinone derivative such as 2,3-dichloro-5,6-dicyano-p-benzoquinone or tetrafluoro-1,4-benzoquinone, 5,8H-5,8-bis(dicyanomethylene)quinoxaline, dipyrazino[2,3-f:2',3'-h]quinoxaline-2,3,6,7,10,11-hexacarbonitrile, and the like.

Among these, from the viewpoint of the stability of the materials, the compatibility with CNT, and the like, organic electron-accepting materials such as a tetracyanoquinodimethane (TCNQ) derivative or a benzoquinone derivative is suitably exemplified.

The P-type dopant and the N-type dopant may be used singly or in combination of two or more thereof.

(N-Type Dopant)

As the N-type dopant, known materials such as (1) alkali metals such as sodium and potassium, (2) phosphines such as triphenylphosphine and ethylenebis(diphenylphosphine), (3) polymers such as polyvinyl pyrrolidone and polyethylene imine, and the like can be used.

In addition, for examples, polyethylene glycol type higher alcohol ethylene oxide adducts, ethylene oxide adducts of phenol, naphthol or the like, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Further, acetylene glycol-based and acetylene alcohol-based oxyethylene adducts, and fluorine-based and silicone-based surfactants can be also used.

As the P-type thermoelectric conversion layer 14$p$ and the N-type thermoelectric conversion layer 16$n$, thermoelectric conversion layers obtained by dispersing the thermoelectric conversion materials in a resin material (binder) are suitably used.

Among these, the thermoelectric conversion layers obtained by dispersing a conductive nanocarbon material in a resin material are more suitably exemplified. Especially, the thermoelectric conversion layer obtained by dispersing CNT in a resin material is particularly suitably exemplified because this makes it possible to obtain high conductivity and the like.

As the resin material, various known nonconductive resin materials (polymer materials) can be used.

Specifically, a vinyl compound, a (meth)acrylate compound, a carbonate compound, an ester compound, an epoxy compound, a siloxane compound, gelatin, and the like may be used.

More specifically, examples of the vinyl compound include polystyrene, polyvinyl naphthalene, polyvinyl acetate, polyvinyl phenol, and polyvinyl butyral. Examples of the (meth)acrylate compound include polymethyl (meth)acrylate, polyethyl (meth)acrylate, polyphenoxy(poly)ethylene glycol (meth)acrylate, and polybenzyl (meth)acrylate. Examples of the carbonate compound include bisphenol Z-type polycarbonate, and bisphenol C-type polycarbonate. Examples of the ester compound include amorphous polyester.

Polystyrene, polyvinyl butyral, a (meth)acrylate compound, a carbonate compound, and an ester compound are preferable, and polyvinyl butyral, polyphenoxy(poly)ethylene glycol (meth)acrylate, polybenzyl (meth)acrylate, and amorphous polyester are more preferable.

In the thermoelectric conversion layer obtained by dispersing a thermoelectric conversion material in a resin material, a quantitative ratio between the resin material and the thermoelectric conversion material may be appropriately set according to the material used, the thermoelectric conversion efficiency required, the viscosity or solid content concentration of a solution exerting an influence on printing, and the like.

In addition, in a case where CNT is used for the P-type thermoelectric conversion layer 14p and the N-type thermoelectric conversion layer 16n, a thermoelectric conversion layer mainly constituted of CNT and a surfactant is also suitably used.

By constituting the thermoelectric conversion layer of CNT and a surfactant, the thermoelectric conversion layer can be formed using a coating composition to which a surfactant is added. Therefore, the thermoelectric conversion layer can be formed using a coating composition in which CNT is smoothly dispersed. As a result, by a thermoelectric conversion layer including a large amount of long and less defective CNT, excellent thermoelectric conversion performance is obtained.

As the surfactant, known surfactants can be used as long as the surfactants function to disperse CNT. More specifically, various surfactants can be used as the surfactant as long as surfactants dissolve in water, a polar solvent, or a mixture of water and a polar solvent and have a group adsorbing CNT.

Accordingly, the surfactant may be ionic or nonionic. Furthermore, the ionic surfactant may be any of cationic, anionic, and amphoteric surfactants.

Examples of the anionic surfactant include an aromatic sulfonic acid-based surfactant such as alkylbenzene sulfonate like dodecylbenzene sulfonate or dodecylphenylether sulfonate, a monosoap-based anionic surfactant, an ether sulfate-based surfactant, a phosphate-based surfactant and a carboxylic acid-based surfactant such as sodium deoxycholate or sodium cholate, and a water-soluble polymer such as carboxymethyl cellulose and a salt thereof (sodium salt, ammonium salt, or the like), a polystyrene sulfonate ammonium salt, or a polystyrene sulfonate sodium salt.

Examples of the cationic surfactant include an alkylamine salt and a quaternary ammonium salt. Examples of the amphoteric surfactant include an alkyl betaine-based surfactant, and an amine oxide-based surfactant.

Further, examples of the nonionic surfactant include a sugar ester-based surfactant such as sorbitan fatty acid ester, a fatty acid ester-based surfactant such as polyoxyethylene resin acid ester, and an ether-based surfactant such as polyoxyethylene alkyl ether.

Among these, an ionic surfactant is preferably used, and cholate or deoxycholate is particularly suitably used.

In the thermoelectric conversion layer including CNT and the surfactant, a mass ratio of surfactant/CNT is preferably 5 or less, and more preferably 3 or less.

It is preferable that the mass ratio of surfactant/CNT is 5 or less from the viewpoint that a higher thermoelectric conversion performance or the like is obtained.

If necessary, the thermoelectric conversion layer formed of an organic material may contain an inorganic material such as $SiO_2$, $TiO_2$, $Al_2O_3$, or $ZrO_2$.

In a case where the thermoelectric conversion layer contains an inorganic material, a content of the inorganic material is preferably 20% by mass or less, and more preferably 10% by mass or less.

The P-type thermoelectric conversion layer 14p and the N-type thermoelectric conversion layer 16n may be formed by a known method. For example, the thllowing method may be used.

First, a coating composition for forming a thermoelectric conversion layer containing a thermoelectric conversion material and required components such as a surfactant is prepared.

Next, the prepared coating composition which becomes a thermoelectric conversion layer is patterned and applied according to a thermoelectric conversion layer to be formed. The application of the coating composition may be performed by a known method such as a method using a mask or a printing method.

After the coating composition is applied, the coating composition is dried by a method according to the resin material, thereby forming the thermoelectric conversion layer. If necessary, after the coating composition is dried, the coating composition (resin material) may be cured by being irradiated with ultraviolet rays or the like.

In addition, the prepared coating composition which becomes the thermoelectric conversion layer is applied to the entire surface of the insulating support and dried, and then the thermoelectric conversion layer may be formed as a pattern by etching or the like.

In a case where a thermoelectric conversion layer is formed by using mainly CNT and a surfactant, it is preferable to form the thermoelectric conversion layer by forming the thermoelectric conversion layer with the coating composition, then immersing the thermoelectric conversion layer in a solvent for dissolving the surfactant or washing the thermoelectric conversion layer with a solvent for dissolving the surfactant and drying the thermoelectric conversion layer.

Thus, it is possible to form the thermoelectric conversion layer having a very small mass ratio of surfactant/CNT by removing the surfactant from the thermoelectric conversion layer and more preferably not containing the surfactant. The thermoelectric conversion layer is preferably formed as a pattern by printing.

As the printing method, various known printing methods such as screen printing, metal mask printing, and ink jetting can be used. In a case where the thermoelectric conversion layer is formed as a pattern by using a coating composition containing CNT, it is more preferable to use metal mask printing.

The printing conditions may be appropriately set according to the physical properties (solid content concentration, viscosity, and viscoelastic properties) of the coating composition used, the opening size of a printing plate, the number of openings, the opening shape, a printing area, and the like.

In a case where the P-type thermoelectric conversion layer 14p and the N-type thermoelectric conversion layer 16n are formed by using the above-described nickel or a nickel alloy, inorganic materials such as BiTe-based material, other than the formation methods using such coating compositions, a film forming method such as a sputtering method, a chemical vapor deposition (CVD) method, a vapor deposition method, a plating method, or an aerosol deposition method may be used to form the thermoelectric conversion layers.

The size of the P-type thermoelectric conversion layer 14p and the N-type thermoelectric conversion layer 16n may be appropriately set according to the size of the module main body 11, the width of the support 12, the size of the connection electrode 18, and the like. In the present invention, the size refers to a size of the support 12 in a plane direction.

As described above, the P-type thermoelectric conversion layer 14p and the N-type thermoelectric conversion layer 16n have the same length in the longitudinal direction. In addition, since the thermoelectric conversion layers are formed at fixed intervals, the P-type thermoelectric conversion layers 14p and the N-type thermoelectric conversion layers 16n are alternately formed at equal intervals.

The thickness of the P-type thermoelectric conversion layer 14p and the N-type thermoelectric conversion layer 16n may be appropriately set according to the material for forming the thermoelectric conversion layers, and the like and is preferably 1 to 20 µm and more preferably 3 to 15 µm.

It is preferable to set the thickness of the P-type thermoelectric conversion layer 14p and the N-type thermoelectric conversion layer 16n to be in the above range from the viewpoint of obtaining good electric conductivity and good printability, and the like.

The thickness of the P-type thermoelectric conversion layer 14p and the thickness of the N-type thermoelectric conversion layer 16n may be the same or different from each other but are basically the same.

In the module main body 11, the connection electrode 18 is formed on the surface of the support 12 on which the P-type thermoelectric conversion layer 14p and the N-type thermoelectric conversion layer 16n are formed.

The connection electrode 18 is provided for electrically connecting the P-type thermoelectric conversion layer 14p and the N-type thermoelectric conversion layer 16n, which are alternately formed in the longitudinal direction, in series. As described above, in the examples shown in the drawing, the thermoelectric conversion layers having a fixed length are formed at fixed intervals in the longitudinal direction. Accordingly, the connection electrodes 18 having a fixed length are formed at fixed intervals. In addition, the module main body 11 is repeatedly mountain-folded and valley-folded along a folding line parallel to the width direction at the center of the connection electrode 18 in the longitudinal direction.

As the material for forming the connection electrode 18, as long as the material has a required conductivity, various conductive materials can be used for electrode formation.

Specific examples thereof include metal materials such as copper, silver, gold, platinum, nickel, aluminum, constantan, chromium, indium, iron, and copper alloy, and materials used for transparent electrodes in various devices, such as indium tin oxide (ITO) and zinc oxide (ZnO). Among these, copper, gold, silver, platinum, nickel, copper alloy, aluminum, constantan, and the like are preferably used, and copper, gold, silver, platinum, and nickel are more preferably used.

In addition, the connection electrode 18 may be a laminated electrode having a configuration in which a copper layer is formed on a chromium layer or the like.

The connection electrode 18 may be pattern-formed by a known method such as a gas phase film formation method such as vacuum vapor deposition or sputtering, or a coating method such as printing according to the material for forming the connection electrode 18.

The size of the connection electrode 18 may be appropriately set according to the size of the module main body 11, the width of the support 12, the size of the P-type thermoelectric conversion layer 14p and the N-type thermoelectric conversion layer 16n, and the like.

In addition, regarding the thickness of the connection electrode 18, a thickness at which the conductivity of the P-type thermoelectric conversion layer 14p and the N-type thermoelectric conversion layer 16n can be sufficiently secured may be appropriately set according to the forming material.

Such a module main body 11 can be prepared by a known method.

For example, the thermoelectric conversion layers and the connection electrodes 18 are formed on the long flat support 12 by patterning using a known method according to the forming material and the through-holes 28 or the reinforcing members 28a are formed at the positions corresponding to the connection electrodes 18 mountain-folded in the longitudinal direction on the outer sides of the connection electrodes 18 of the like in the width direction. Then, by performing known bending processing of a sheet-like material such as press processing or processing by a roller having protrusions, the support is folded in a bellows-like shape to form the bellows-like module main body 11.

In addition, these operations are preferably performed by continuously performing various treatments while transporting the support 12 (a substrate to be treated) in the longitudinal direction, a so-called roll-to-roll process.

As described above, the module 10 has a configuration in which the module main body 11 and the insulating member 20 are laminated and the wire 24 is inserted through the module main body and the insulating member. The insulating member 20 is a kind of bellows-like member in the present invention.

The insulating member 20 is obtained by forming a heat conductive layer 32 on one surface of a long support 30 (insulating layer) having insulating properties and flexibility and is alternately mountain-folded and valley-folded in a bellows-like shape like the module main body 11. In the example, a side where the support 30 becomes an inner side by folding the insulating member 20, that is, the heat conductive layer 32 projects is a mountain fold, and a side where the support 12 becomes an outer side, that is, the heat conductive layer 32 is concave is a valley fold.

The insulating member 20 is laminated on the module main body 11 such that concave and convex portions thereof are fitted to those of the module main body while the support 30 is caused to face the surface of the module main body 11 on which the connection electrodes 18 and thermoelectric conversion layers are formed.

For the support 30, various sheet-like materials having insulating properties and flexibility can be used. Specifically, the above-described sheet-like materials mentioned in the examples of the module main body 11 may be used.

The width of the support 30, that is, the width of the insulating member 20 may be appropriately set according to the width of the module main body 11. In addition, the length of the support 30 may be appropriately set according to the length of the module main body 11, and the height of the concave and convex portions of the module main body 11 and the insulating member 20.

Regarding the thickness of the support 30, a thickness that can secure sufficient insulating properties and can function as a support of the heat conductive layer 32 may be appropriately set according to the size of the module 10 and the like.

The heat conductive layer 32 is a layer that is formed of a material having high thermal conductivity. In the module 10 in the example shown in the drawing, as a preferable embodiment, the insulating member 20 has the heat conductive layer 32.

Accordingly, the insulating member 20 does not necessarily have the heat conductive layer 32 and the insulating member 20 may include only the insulating support 30.

However, since the insulating member 20 also functions as a heat dissipation member by providing the insulating member 20 with the heat conductive layer 32, a temperature difference between the thermoelectric conversion layers is increased. Thus, the power generation capacity can be improved. Further, the bellows-like shape of the insulating member 20 can be suitably maintained by forming the heat conductive layer 32 using a metal material or the like.

For the material for forming the heat conductive layer 32, various materials used for a so-called heat dissipation fin and the like may be used. Specific examples thereof include various metal materials such as copper and aluminum, inorganic compounds such as alumina, boron nitride, and aluminum nitride, and carbon materials such as graphite. Among these, metal materials such as copper and aluminum are suitably used.

Regarding the thickness of the heat conductive layer 32, according to the material for forming the heat conductive layer 32, the size of the concave and convex portions of the insulating member 20, and the like, a thickness at which required thermal conductivity, that is, heat dissipation effect can be obtained may be appropriately set.

The heat conductive layer 32 may be formed by a known method, such as a vacuum film formation such as vacuum vapor deposition method or a coating method such as printing, according to the forming material, like the connection electrode 18.

In such an insulating member 20, through-holes 36 are formed in the vicinities of both end portions of the sloped surface formed by bellows-like folding in the width direction.

Specifically, the through-holes 36 of the insulating member 20 are formed at the same positions of the positions of the through-holes 28 of the module main body 11 in the width direction. In addition, a pair of through-holes is formed at the positions symmetrical with the folding line of the valley fold in the valley fold portion in the longitudinal direction.

Like the through-holes 28 of the module main body 11, the through-holes 36 are preferably formed at positions that are linearly aligned in the longitudinal direction in a case where the insulating member 20 is folded in a bellows-like shape. Further, the through-holes 36 are preferably formed such that in a case where the insulating member 20 is laminated on the module main body 11, the through-holes 36 are linearly aligned with the through-holes 28 of the module main body 11.

The insulating member 20 can be prepared by a known method like the above-described module main body 11.

For example, the heat conductive layer 32 is formed over one entire surface of the long flat support 30 by a known method according to the forming material and the through-holes 36 are formed at predetermined positions on the support 30.

Thereafter, by performing known bending processing of a sheet-like material such as press processing or processing by a roller having protrusions, the support is folded in a bellows-like shape to form the bellows-like insulating member 20.

These operations are preferably performed by a roll-to-roll process like the module main body 11. In addition, the insulating member 20 may be prepared by using a commercially available product in which a metal layer or the like is formed on a support formed of a resin.

As described above, in the module 10 of the present invention, the bellows-like insulating member 20 is laminated on the bellows-like module main body 11 such that the concave and convex portions thereof are fitted to those of the module main body and the flexible wire 24 which penetrates the through-holes 28 of the module main body 11 and the through-holes 36 of the insulating member 20 so as to be inserted through the module main body 11 and the insulating member 20 is provided. That is, the wire 24 is inserted through the module main body and the insulating member by combining the module main body 11 and the insulating member 20, and thus, a state in which the module main body 11 and the insulating member 20 are combined while the concave and convex portions of the bellows thereof are being fitted to each other is maintained.

In the present invention, by adopting such a configuration, the module 10 in which the bellows-like insulating member 20 or a heat dissipation member is combined with the bellows-like module main body 11 and which is capable of improving handleability by making it possible to maintain the configuration in which the module main body 11, the insulating member 20, and the like are stably combined, and further having flexibility, and is capable of easily mounted on, for example, a tubular heat source or the like with good handleability.

As disclosed in JP2005-328000A or the like, a bellows-like thermoelectric conversion module having flexibility is known. In such a bellows-like thermoelectric conversion module having flexibility, for example, for the purpose of reducing the size, improving heat transfer efficiency, improving the mounting density of a thermoelectric conversion element, and the like, it is advantageous to compress the folded support in the longitudinal direction, that is, in the arrangement direction of the thermoelectric conversion layer to close the bellows as much as possible.

However, in the bellows-like thermoelectric conversion module of the related art, in a case where the bellows is closed, the electrodes come into contact with each other in the mountain fold portion to cause a short circuit. Thus, power is not generated.

Therefore, in a case where the bellows of the bellows-like thermoelectric conversion module is closed, it is considered that the insulating member is combined with the thermoelectric conversion module.

In a case where a member is combined with the bellows-like thermoelectric conversion module, naturally, the member to be combined preferably has a bellows-like shape. For example, in order to prevent the electrodes from coming into contact with each other in the mountain fold portion in the bellows-like thermoelectric conversion module, a configuration in which a long insulator formed by folding an insulating member in a bellows-like shape is laminated on the thermoelectric conversion module and the connection electrode in the mountain fold portion is covered by the insulating member can be considered.

Thus, even in a state in which the bellows of the thermoelectric conversion module is closed, it is possible to prevent a short circuit between the connection electrodes in the mountain fold portion.

Here, only by laminating the bellows-like member on the bellows-like thermoelectric conversion module, in a case of mounting the thermoelectric conversion module on a heat source or the like, the bellows-like member is easily detached from the thermoelectric conversion module. Therefore, for example, in a case where the bellows-like thermoelectric conversion module on which the bellows-like member is laminated is mounted on a tubular heat source or the like, it is necessary that the bellows-like member is wound or the like while pressing the bellows-like member, and while maintaining a state in which the bellows-like member and the thermoelectric conversion module are laminated, the thermoelectric conversion module is mounted on the heat source.

That is, only by laminating the bellows-like member on the bellows-like thermoelectric conversion module, the handleability and the workability of mounting on a heat source is deteriorated. In addition, in order to prevent the bellows-like member from being detached from the thermoelectric conversion module, the shape of the heat source or the like may be limited.

In contrast, in the module 10 of the present invention, the bellows-like module main body 11 having flexibility and the bellows-like insulating member 20 having flexibility are laminated such that concave and convex portions thereof are fitted to each other, and also the wire 24 which penetrates the through-holes 28 formed on the sloped surfaces of the module main body 11 and the through-hole 36 formed on the sloped surfaces of the insulating member 20 so as to be inserted through the module main body 11 and the insulating member 20 is provided.

Therefore, even in a case where the module 10 is deformed by bending or the like or only either of the module main body 11 and the insulating member 20 is supported, the module main body 11 and the insulating member 20 are not separated from each other.

In addition, since not only the module main body 11 and the insulating member 20, but also the wire 24 has flexibility, the module can be bent in the longitudinal direction. For example, it is possible to mount the module on heat sources having various shapes such as a tubular heat source in a curved state along a curved surface. In addition, since the wire 24, that is, a linear member is inserted through the module, main body 11 and the insulating member 20, the bellows can be easily closed by being pressed in the longitudinal direction and further, the degree of compression in the pressed state, that is, the interval between the concave and convex portions of the bellows (the interval of the bellows) can be easily changed wholly or partially. However, the module main body 11 and the insulating member 20 are not separated from each other.

Therefore, the module has good handleability and even in a case where the module is mounted on heat source having various shapes such as a curved surface and a bent surface, the module can be mounted with good workability.

Further, since the insulating member 20 is laminated on the module 10 in the example shown in the drawing so as to cover the connection electrodes 18 on the mountain fold side, while the support 30 is caused to face the module main body 11, as shown in FIG. 1C, even in a case where the bellows of the module 10 is closed, it is possible to prevent a short circuit caused by a contact between the connection electrodes 18 on the mountain fold side.

In the module 10 of the present invention, as the wire 24, various linear members having flexibility can be used. Specifically, a thread (string), a metal wire such as a wire, a metal wire covered by an insulating material or the like may be used.

In the module 10 of the present invention, the penetration position of the wire 24 in the module main body 11 is preferably set to positions other than portions where the thermoelectric conversion layers and the connection electrodes 18 are formed. Thus, it is possible to prevent a reduction in the area of the thermoelectric conversion layers and the electrodes and to secure the strength of the module 10. Further, even in a case of using the wire 24 having electric conductivity, it is possible to prevent a short circuit between the thermoelectric conversion layers or the electrodes, and the wire.

Particularly, as shown in the example of the drawing, it is preferable that the wire 24 penetrates the sloped surfaces on the outer side of the connection electrode 18 in the width direction and at the same position as the position of the connection electrode 18 in the longitudinal direction (in the slope direction of the sloped surface). In a case where the module 10 is pressed in the longitudinal direction and the bellows is closed (the bellows is folded) as shown in FIG. 1C, it is considered to maintain a state in which the bellows is closed by binding the module with the wire 24. Therefore, as shown in the example of the drawing, by inserting the wire 24 through the sloped surfaces on the outer side of the connection electrode 18 in the width direction and at the same position as the position of the connection electrode 18 in the longitudinal direction, in a case where the bellows is closed, the connection electrodes typically formed of a metal material can be closely attached to each other through the support 12, and on the mountain fold side, the temperature unevenness of thermoelectric conversion layers in the width direction and the longitudinal direction is reduced. Thus, it is possible to perform highly efficient power generation.

As described above, in the insulating member 20, the heat conductive layer 32 formed of a metal material or the like is provided on one surface of the insulating support 30, and the insulating member functions as a heat dissipation member.

Figure 3:
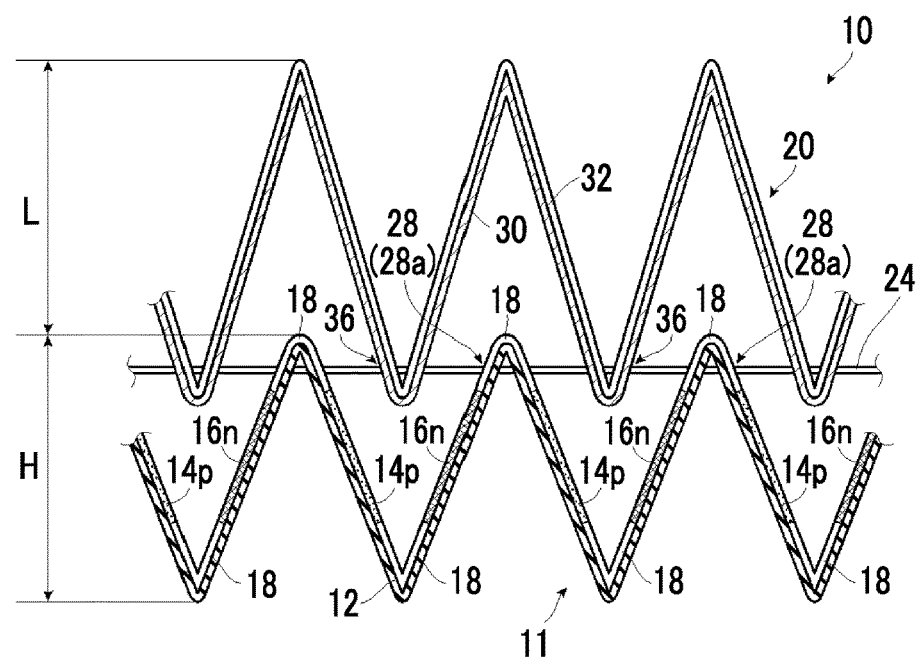
FIG. 3 is a schematic front view showing another example of the thermoelectric conversion module according to the present invention.

Accordingly, as conceptually shown in FIG. 3, the mountain fold portion of the insulating member 20 may significantly project from the module main body 11 by setting the height of mountain fold portion of the insulating member 20 to be higher than the height of the mountain fold portion of the module main body 11. Thus, the temperature difference between the thermoelectric conversion layers is increased by causing the insulating member 20 to function as a heat dissipation fin so that the power generation capacity of the module 10 can be increased. In addition, in the example shown in the drawing, since the wire 24 is inserted at the same position as the position of the connection electrode 18 in the longitudinal direction, the connection electrode 18 having high thermal conductivity and the heat conductive layer 32 of the insulating member 20 functioning as a heat dissipation fin can be closely attached through the support 30 and thus the heat dissipation effect can be improved.

In addition, for example, in a case where the module main body 11 is mounted on a curved surface of a tubular heat source or the like, the mountain fold portions of the insulating member 20 are separated from each other and thus the insulating member 20 further functions as a heat dissipation fin. Thus, the power generation capacity can be improved. Regarding this point, the same applies to other embodiments.

Here, the height of the concave and convex portions of the module main body 11 is set to H, a difference between the height of the mountain fold portion (the top portion thereof) of the module main body 11 and the height of the mountain fold portion of the insulating member 20 (the same as mentioned above) is set to a projection amount L, the projection amount L is preferably 0.5 to 5 times the height H. That is, it is preferable to satisfy "$0.5H \leq L \leq 5H$".

By setting the projection amount L of the mountain fold portion of the insulating member 20 to be 0.5 times or more the height H of the concave and convex portions of the module 10, a sufficient heat dissipation effect is obtained and thus the power generation capacity can be improved.

In addition, by setting the projection amount L of the mountain fold portion of the insulating member 20 to be 5 times or less the height H of the concave and convex portions of the module 10, the module 10 is prevented from unnecessarily being enlarged and thus improvement in a degree of freedom of installation place, the expanding of the use of the module 10, and the like can be facilitated.

The height of the mountain fold portions of the insulating member 20 may be different. That is, the insulating member 20 may have concave and convex portions having different heights (mountain fold portions having different heights). This configuration is particularly effective in a case where the mountain fold portion of the insulating member 20 significantly projects from the module main body 11 as shown in FIG. 3.

At this time, in a case where the projection amount of the mountain fold portion of the insulating member 20 is set to be the same as the above projection amount L, the projection amount of the highest mountain fold portion is set to the maximum projection amount L1, and a projection amount of other mountain fold portions is set to L2, a difference Ld between the maximum projection amount L1 and the projection amount L2 is preferably ½ or more of the maximum projection amount L1. That is, it is preferable to satisfy "Ld≥0.5L1 (where Ld=L1−L2)".

In the insulating member 20 having top portions having different heights, by setting the difference Ld between the maximum projection amount L1 and the projection amount L2 to ½ or more of the maximum projection amount L1, the projection portion of the insulating member 20 in the module 10 is suitably prevented from being filled with air and heat dissipation effect is improved. Thus, a larger power generation capacity can be obtained.

Figure 4A:
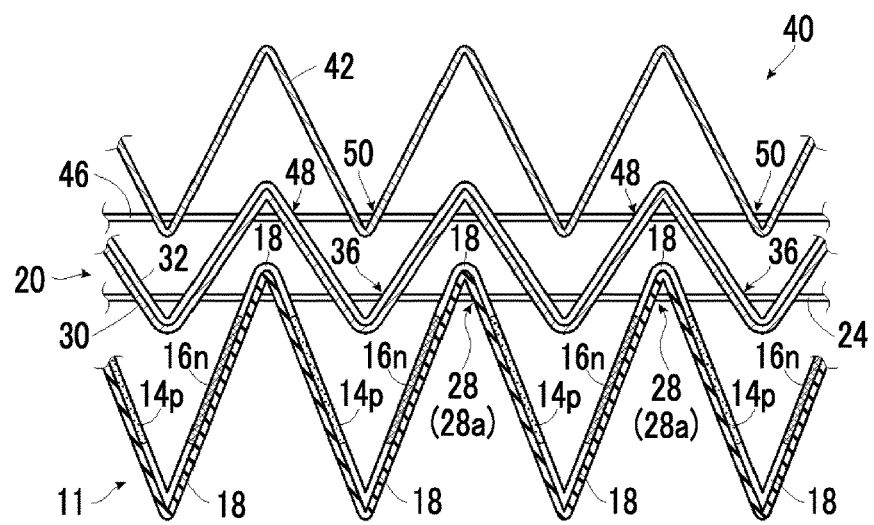
FIG. 4A is a schematic front view showing still another example of the thermoelectric conversion module according to the present invention.
Figure 4B:
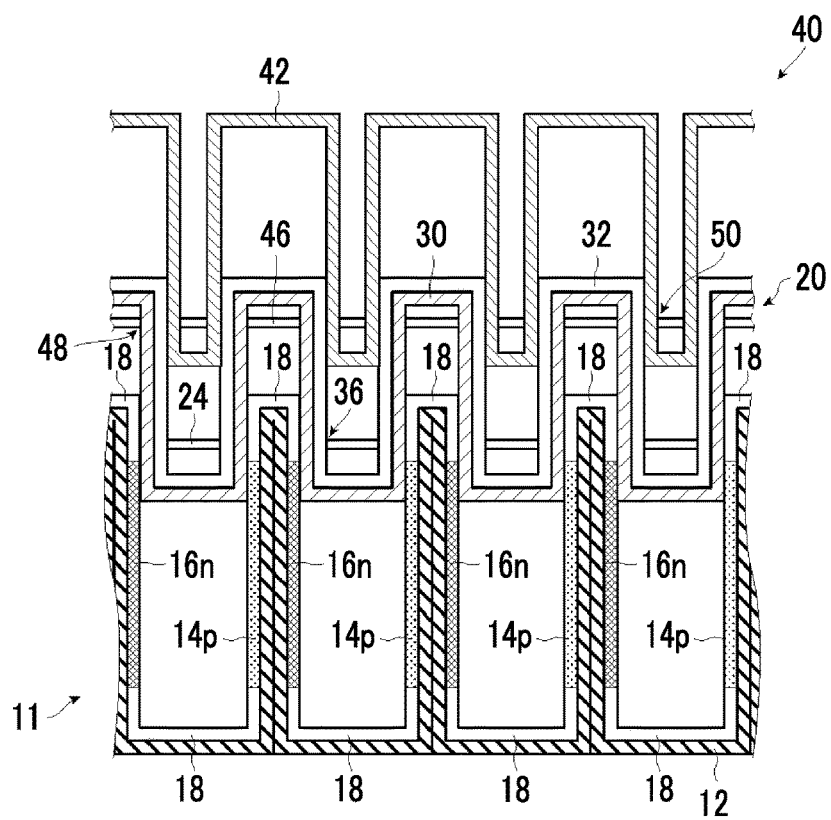
FIG. 4B is a schematic front view showing a state in which a bellows of the thermoelectric conversion module shown in FIG. 4A is closed.

FIG. 4A conceptually shows still another example of the thermoelectric conversion module of the present invention. FIG. 4B conceptually shows a state in which a bellows of the thermoelectric conversion module shown in FIG. 4A is closed.

In a thermoelectric conversion module shown in FIG. 4A, a large number of members the same as the members in the above-described thermoelectric conversion module shown in FIG. 1A or the like are used. Thus, the same reference numerals are attached to the same members and different portions are mainly described. Regarding this point, the same applies to other embodiments of the thermoelectric conversion module of the present invention including the heat conductive laminate of the present invention which will be described later.

The module 10 shown in FIGS. 1A to 1C has a configuration in which the insulating member 20 is laminated on the module main body 11 such that the concave and convex portions of the bellows thereof are fitted to those of the module main body and the wire 24 is inserted through both the module main body and the insulating member.

In contrast, a thermoelectric conversion module 40 shown in FIG. 4A is configured such that a bellows-like heat dissipation member 42 is laminated on the insulating member 20 of the module 10 such that concave and convex portions of a bellows thereof are fitted to those of the insulating member, and a wire 46 as a second linear member is inserted through the insulating member 20 and the heat dissipation member 42. That is, the heat dissipation member 42 is laminated on a surface of the insulating member 20 on a side opposite to the module main body 11. The heat dissipation member 42 is one of bellows-like members in the present invention.

In the following description, the thermoelectric conversion module 40 is also referred to as a "module 40".

The heat dissipation member 42 is formed by alternately folding a sheet-like material formed of a highly heat conductive material in a mountain-folded manner and valley-folded manner to be formed in a bellows-like shape. In the example, a projection side of the heat dissipation member 42 on the insulating member 20 side becomes a valley fold and the other side thereof becomes a mountain fold.

As the material for forming the heat dissipation member 42, various materials such as metal materials mentioned in the above examples of the materials for forming the heat conductive layer 32 can be used. In addition, for folding processing to form a bellows-like shape, known methods such as press processing may be performed.

In the module 40, on the sloped surface of the insulating member 20 formed by bellows-like folding, through-holes 48 are formed in the vicinities of both end portions in the width direction. A pair of through-holes 48 is formed in the mountain fold portion in the longitudinal direction to be symmetrical to the folding line of the mountain fold. It is preferable that the through-holes 48 are linearly formed in the longitudinal direction in a case where the insulating member 20 is folded in a bellows-like shape.

On the other hand, on the sloped surface of the heat dissipation member 42 formed by bellows-like folding, in the vicinities of both end portions in the width direction, through-holes 50 are formed. The through-holes 50 are formed at the same positions of the through-holes 48 in the width direction. In addition, a pair of through-holes 50 is formed in the valley fold portion in the longitudinal direction to be symmetrical to the folding line of the valley fold. It is preferable that the through-holes 50 are linearly formed in the longitudinal direction in a case where the heat dissipation member 42 is folded in a bellows-like shape. Further, it is preferable that the through-holes 50 are formed to be linear with the through-holes 48 of the insulating member 20 in a case where the heat dissipation member 42 is laminated on the insulating member 20.

The module 40 has a configuration in which the heat dissipation member 42 formed of a heat conductive material is laminated on a laminate of the module main body 11 and the insulating member 20 into which the wire 24 is inserted, that is, on the insulating member 20 of the module 10, and the wire 46 penetrates the through-holes 48 of the insulating member 20 and the through-holes 50 of the heat dissipation member 42 so as to be inserted through the insulating member 20 and the heat dissipation member 42.

Accordingly, since the heat dissipation member 42 functions as a heat dissipation fin, a temperature difference between the thermoelectric conversion layers is increased and thus a large power generation capacity can be obtained in the module 40.

In addition, the wire 24 is inserted through the module main body 11 and the insulating member 20, and the wire 46 is inserted through the insulating member 20 and the heat dissipation member 42. Therefore, since the bellows is easily closed and the interval between the concave and convex portions of the bellows, that is, the interval of the bellows is easily controlled without separation of each member as in the above-described module 10, handleability is good and in a case of mounting the module on heat sources having various shapes such as a curved surface, mounting can be performed with good workability.

In the module 40 having the heat dissipation member 42, it is preferable to set the projection amount of the mountain fold portion of the heat dissipation member 42 to be the same as shown the example in FIG. 3 while changing the reference of the projection amount to the projection amount of the mountain fold portion (the top portion thereof) of the insulating member 20.

In addition, in the module 40 having the heat dissipation member 42, the heat dissipation member 42 may also have mountain fold portions having different heights that is, concave and convex portions having different heights. In this case, it is preferable that a difference between the heights of the mountain fold portions of the heat dissipation member is the same as in the above-described example.

Further, in the module 40 shown in FIG. 4A, two wires are used. The wire 24 is inserted through the laminated module main body 11 and insulating member 20, the heat dissipation member 42 is laminated thereon, and the wire 46 is inserted through the insulating member 20 and the heat dissipation member 42. However, the thermoelectric conversion module of the present invention is not limited thereto.

That is, according to the positional relationship between the module main body 11, the insulating member 20, and the heat dissipation member 42, the size of the concave and convex portions of the bellows, the amount of convex portions inserted through concave portions of the bellows, and the like, if possible, a common wire may be inserted through the module main body 11, the insulating member 20, and the heat dissipation member 42. Regarding this point, the same applies to various configurations which will be described later such as a configuration in which three or more bellows-like materials are laminated. That is, in the present invention, various lamination configuration in which three or more bellows-like materials are laminated, a common wire may be inserted through the three or more bellows-like materials.

The thermoelectric conversion module of the present invention may adopt various configurations in which a bellows-like member such as the insulating member 20 is laminated on the bellows-like module main body 11, in addition to the configuration in which the wire 24 is inserted through the laminated module main body 11 and insulating member 20 shown in FIGS. 1A to 1C and the configuration in which the wire 24 is inserted through the laminated module main body 11 and insulating member 20, the heat dissipation member 42 is further laminated thereon, and the wire 46 is inserted through the insulating member 20 and the heat dissipation member 42 shown in FIGS. 4A and 4B.

For example, as conceptually shown in FIG. 5, the heat dissipation member 42 is provided below the module main body 11, instead of on the insulating member 20, while the concave and convex portions of the bellows thereof are fitted to those of the module main body. A configuration in which a wire 52 is inserted through the module main body 11 and the heat dissipation member 42 is shown. That is, a configuration in which the heat dissipation member 42 is provided on the support 12 side of the module main body 11 instead of on the insulating member 20, and a wire 52 is inserted through the module main body 11 and the heat dissipation member 42 is shown. In other words, a configuration in which the heat dissipation member 42 is provided on the support 12 side of the module main body 11 which is a side opposite to the insulating member 20, and the module main body 11 is sandwiched between the insulating member 20 on the mountain fold side and the heat dissipation member 42 on the valley fold side is shown.

Figure 6:
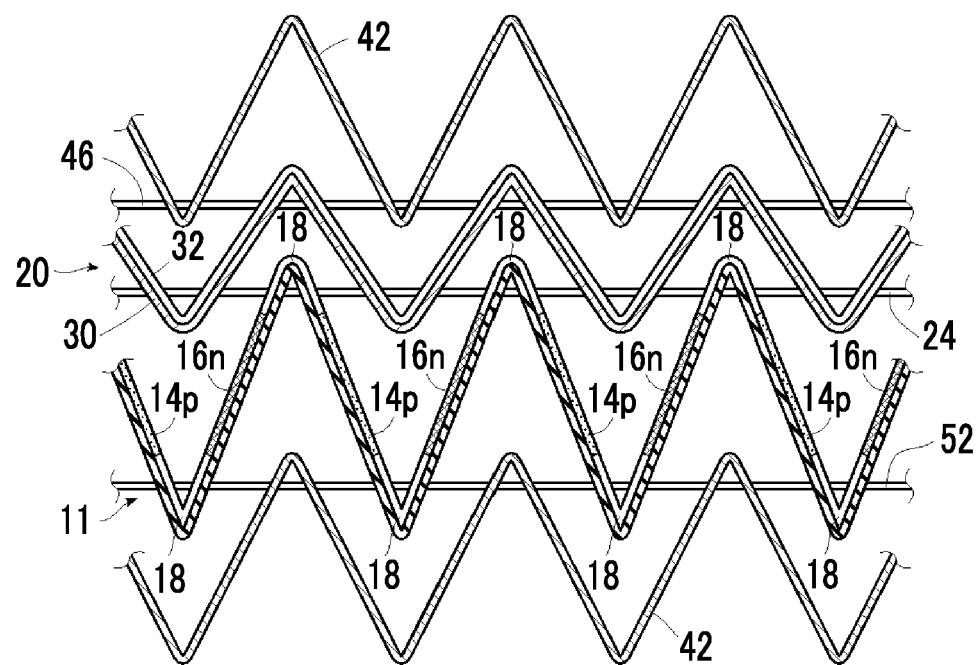
FIG. 6 is a schematic front view showing still another example of the thermoelectric conversion module according to the present invention.

In addition, as another example, as conceptually shown in FIG. 6, a configuration in which the heat dissipation member 42 is arranged so as to sandwich a configuration in which the module main body 11 and the insulating member 20 are laminated white fitting the concave and convex portions of the bellows thereof to each other, and the wire 24 is inserted through the module main body and the insulating member, the wire 52 is inserted through the heat dissipation member 42 and the module main body 11, and the wire 46 is inserted through the insulating member 20 and the heat dissipation member 42 can also be used.

Further, in the thermoelectric conversion module shown in FIG. 5, a configuration in which only the module main body 11 and the heat dissipation member 42 are laminated such that the heat dissipation member 42 is provided below the module main body 11, that is, on the support 12 side without providing the insulating member 20 can also be used.

Figure 5:
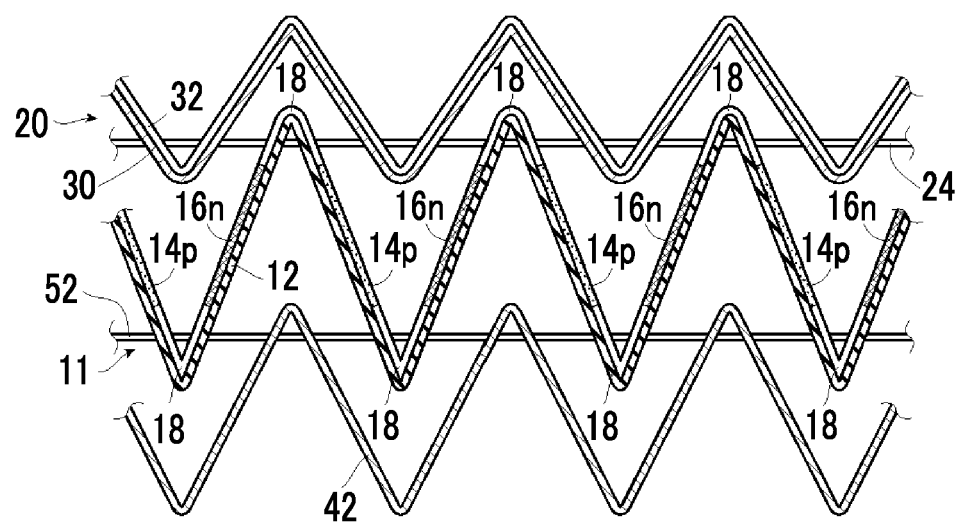
FIG. 5 is a schematic front view showing still another example of the thermoelectric conversion module according to the present invention.

The through-hole which the wire (linear member) penetrates is basically the same as the through-hole 28 of the module main body 11, the through-hole 36 of the insulating member 20, the through-hole 48 of the insulating member 20, and the through-hole of the heat dissipation member 42, and thus is not shown in FIGS. 5 and 6.

In the above example, the insulating member 20 and the heat dissipation member 42 are used as bellows-like members. However, in the present invention, as long as the member has a bellows-like shape, in addition to these members, various members can be used.

Specifically, as bellows-like members other than the insulating member 20 and the heat dissipation member 42, a member for adjusting a distance between bellows and the like may be used. The member for adjusting a distance between bellows may be formed of, for example, a metal.

In the thermoelectric conversion module 10 of the present invention, generally, the width of the insulating member 20 and the heat dissipation member 42 is the same as the width of the module main body 11. However, the present invention is not limited thereto.

Figure 7:
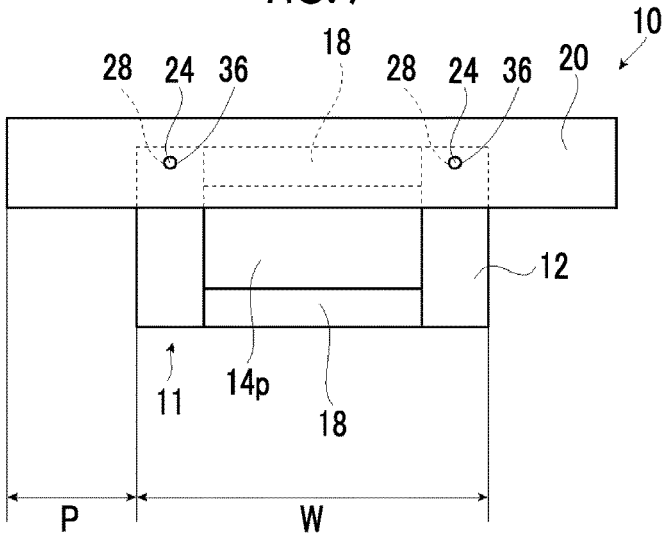
FIG. 7 is a conceptual front view for illustrating still another example of the thermoelectric conversion module according to the present invention.

For example, as conceptually shown in FIG. 7 using the module 10 shown in FIGS. 1A to 1C as an example, the size of the insulating member 20 in the width direction may be set to be larger than the size of the module main body 11 in the width direction and on one side in the width direction or on both sides in the width direction, the insulating member 20 may project from an end portion of the module main body 11 in the width direction.

FIG. 7 is a view of the module 10 as viewed from the longitudinal direction, that is, a view of FIG. 1A as viewed from the horizontal direction in the drawing.

In addition, as shown in FIGS. 5 and 6, even in a case where the heat dissipation member 42 is used in addition to the insulating member 20, similarly, the insulating member 20 and/or the heat dissipation member 42 may project from the end portion of the module main body 11 in the width direction. As shown in FIG. 6, in a case of using two heat dissipation members 42, one heat dissipation member 42 or both heat dissipation members 42 may project from the end portion of the module main body 11 in the width direction. Further, also, in the configuration in which the heat dissipation member 42 is provided on the support 12 side of the module main body 11 without providing the insulating member 20, the heat dissipation member 42 may project from the end portion of the module main body 11 in the width direction.

As described above, the insulating member 20 is obtained by forming the heat conductive layer 32 on the surface of the insulating support 30 and can exert a function as a heat dissipation member. In addition, the heat dissipation member 42 is formed of a highly heat conductive material.

Accordingly, as shown in FIG. 7, a region of the insulating member 20 projecting from the module main body 11 can be made to function as a heat dissipation fin by causing the insulating member 20 (heat dissipation member 42) to project from the module main body 11 in the width direction, and a good heat dissipation effect can be obtained. Therefore, according to the configuration, the temperature difference between the thermoelectric conversion layers of the module main body 11 is increased and thus the power generation capacity in the thermoelectric conversion module can be increased.

The projection amount of the insulating member 20 from the module main body 11 in the width direction may be appropriately set according to the size of the module 10, a presumed installation place of the module 10, and the like.

Specifically, as shown in FIG. 7, in a case where the width of the module main body 11 is set to W, and the projection amount of the insulating member 20 (heat dissipation member 42) from the module main body 11 in the width direction is set to P, the projection amount P is preferably 0.1 to 10 times the width W of the module main body 11. That is, it is preferable to satisfy "0.1 W≤P≤10 W".

By setting the projection amount P of the insulating member 20 in the width direction to be 0.1 times or more the width W of the module main body 11, a sufficient heat dissipation effect can be obtained and the power generation capacity can be improved.

By setting the projection amount P of the insulating member 20 in the width direction to be 10 times or less the width W of the module main body 11, the module 10 is prevented from being unnecessarily enlarged and improvement in a degree of freedom of installation place, the expanding of the use of the module 10, and the like can be facilitated.

In the configuration in which the heat dissipation member 42 projects from the module main body 11 in the width direction, the heat dissipation member 42 may project from the insulating member 20 as shown in FIG. 4A. However, the projection amount from the insulating member 20 may be little.

That is, in a case where the heat dissipation member 42 projects from the module main body 11 in the width direction, a difference between the height of the mountain fold portion of the heat dissipation fin and the height of the mountain fold portion of insulating member 20 may be only the thickness of the heat dissipation member 42.

Regarding this point, the same applies to the thermoelectric conversion modules shown in FIGS. 5 and 6.

In the above example, the bellows-like insulating member 20 and/or bellows-like heat dissipation member 42 is combined with the bellows-like module main body 11 as a bellows-like member. However, in the present invention, as a bellows-like member, a bellows-like thermoelectric conversion member can also be used.

Figure 8:
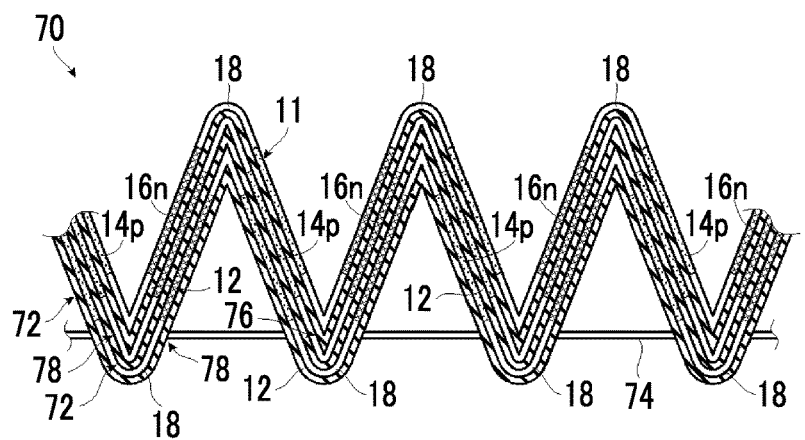
FIG. 8 is a schematic front view showing still another example of the thermoelectric conversion module according to the present invention.

FIG. 8 shows an example thereof.

A thermoelectric conversion module 70 shown in FIG. 8 has a configuration in which two bellows-like thermoelectric conversion members 72 are laminated on a support 12 side of a module main body 11 such that concave and convex portions thereof are fitted to those of the module main body, and a wire 74 is inserted through the module main body 11 and the two thermoelectric conversion members 72. In the thermoelectric conversion module 70 shown in FIG. 8, the module main body 11 does not have through-holes 28 and reinforcing members 28a that are formed in mountain fold portions.

In the following description, the thermoelectric conversion module 70 is also referred to as "module 70".

The thermoelectric conversion member 72 has thermoelectric conversion layers which are formed on one surface of the support and are separated from each other, and connection electrodes which connects adjacent thermoelectric conversion layers. The thermoelectric conversion member 72 also generates power by thermoelectric conversion like the module main body 11. That is, both the module main body 11 and the thermoelectric conversion member 72 are bellows-like power generation module single bodies which generate power by thermoelectric conversion.

The thermoelectric conversion member 72 shown in FIG. 8 has the same configuration as the configuration of the module main body 11 as a preferable embodiment.

That is, the thermoelectric conversion member 72 alternately has P-type thermoelectric conversion layers 14p and N-type thermoelectric conversion layers 16n having a fixed length at fixed intervals in the longitudinal direction of the long support 12. In addition, the thermoelectric conversion member 72 has connection electrodes 18 which connect adjacent P-type thermoelectric conversion layers 14p and N-type thermoelectric conversion layers 16n and has a bellows-like shape in which thermoelectric conversion member is alternately mountain-folded and valley-folded at the centers of the connection electrodes 18 in the longitudinal direction.

One of the two thermoelectric conversion members 72 is laminated on the module main body 11 to face the support 12 of the module main body 11 and the thermoelectric conversion layers (member thermoelectric conversion layers) of the thermoelectric conversion members.

The other thermoelectric conversion member 72 is laminated on the thermoelectric conversion member 72 to face the support 12 (member support) of the thermoelectric conversion member 72 to be laminated on the module main body 11 and the thermoelectric conversion layer of the thermoelectric conversion member.

Through-holes 76 are formed in the vicinities of both end portions of the valley fold portion in the width direction on the sloped surface of the module main body 11. Preferably, the through-hole 76 is formed in a reinforcing member like the reinforcing member 28a.

Similar to the through-holes 28, as a preferable embodiment, the through-holes 76 are formed in regions in the width direction other than regions where the P-type thermoelectric conversion layers 14p and the N-type thermoelectric conversion layers 16n, and the connection electrodes 18 are formed in the width direction of the support 12. In addition, a pair of through-holes 28 is formed at the same position as the position of the valley-folded connection electrode 18 in the longitudinal direction and at the positions symmetrical to the center of the connection electrode 18 in the longitudinal direction (refer to the folding line indicated by a dashed line in FIG. 2).

Further, similar to the through-holes 28, preferably, the through-holes 76 are formed at the positions where the through-holes are linearly arranged in the longitudinal direction in a case where the support 12 is folded in a bellows-like shape.

In the thermoelectric conversion member 72, through-holes 78 are also formed in the vicinities of both end portions of the valley fold portion on the sloped surface in the width direction. Preferably, the through-hole 78 is formed in a reinforcing member like the reinforcing member 28a.

Specifically, the through-holes 78 of the thermoelectric conversion member 72 are formed at the same positions as the positions of the through-holes 76 of the module main body 11 in the width direction. In addition, a pair of through-holes 78 is formed at the positions symmetrical to the folding line of the valley fold in the valley fold portion in the longitudinal direction.

Preferably, the through-holes 78 are formed at the positions where the through-holes are linearly arranged in the longitudinal direction in a case where the thermoelectric conversion member 72 is folded in a bellows-like shape. Further, preferably, the through-holes 78 are formed such that the through-holes are linearly aligned with the through-holes 76 of the module main body 11 in a case where the thermoelectric conversion member 72 is laminated on the module main body 11.

In the module 70, the wire 74 penetrates the through-holes 76 of the module main body 11 and the through-holes 78 of the thermoelectric conversion member 72 so as to be inserted through the module main body 11 and the two theiuioelectric conversion members 72.

Accordingly, since the bellows is easily closed and the interval between the concave and convex portions of the bellows, that is, the interval of the bellows is easily controlled without separation of each member in the module 70 as in the above-described module 10, handleability is good and in a case of mounting the module on heat sources having various shapes such as a curved surface, mounting can be performed with good workability. In addition, since the module 70 has a configuration in which three bellows-like power generation module single bodies which substantially generate power by thermoelectric conversion are laminated, a large power generation capacity can be obtained. Further, since the thermoelectric conversion layers of the module main body 11 and the thermoelectric conversion members 72 are laminated to face the support 12 of another member, in a case where bellows is closed, a short circuit in the thermoelectric conversion layers can be prevented.

As described above, like the module main body 11, the thermoelectric conversion member 72 is a bellows-like power generation module single body which generates power by thermoelectric conversion. In addition, in the example shown in the drawing, as a preferable embodiment, the thermoelectric conversion member 72 has the same configuration as the configuration of the module main body 11.

In the present invention, in the configuration in which a plurality of bellows-like power generation module single bodies which generate power by thermoelectric conversion are provided as described above, any of the bellows-like power generation module single bodies may be considered as a module main body in the thermoelectric conversion module of the present invention.

Accordingly, in the module 70, any of bellows-like power generation module single bodies of the thermoelectric conversion members 72 and the module main body 11 may be considered as a module main body in the present invention.

For example, in the above-described description, the module 70 shown in FIG. 8 has a configuration in which the module main body 11, one thermoelectric conversion member 72 which is laminated on the support 12 of the module main body 11 to face the thermoelectric conversion layer (member thermoelectric conversion layer), and the other thermoelectric conversion member 72 which is laminated on the support 12 (member support) of the thermoelectric conversion member 72 to face the thermoelectric conversion layer are provided (configuration of module main body 11/thermoelectric conversion member 72/thermoelectric conversion member 72).

However, the module 70 shown in FIG. 8 may be considered to have a configuration in which the module main body 11, the thermoelectric conversion member 72 which is laminated on the support 12 of the module main body 11 to face the thermoelectric conversion layer, and the thermoelectric conversion member 72 which is laminated on the thermoelectric conversion layer of the module main body 11 to face the support 12 are provided (configuration of thermoelectric conversion member 72/module main body 11/thermoelectric conversion member 72).

Alternatively, the module 70 may be considered to have a configuration in which the module main body 11, the thermoelectric conversion member 72 which is laminated on the thermoelectric conversion layer of the module main body 11 to face the support 12, the thermoelectric conversion member 72 which is laminated on the support 12 of the thermoelectric conversion member 72 to face the thermoelectric conversion layer are provided (configuration of thermoelectric conversion member 72/thermoelectric conversion member 72/module main body 11).

Regarding this point, the same applies to a case where the plurality of bellows-like power generation module single bodies, and the configurations of the bellows-like power generation module single bodies are different as described later, and any configuration of the bellows-like power generation module single bodies may be considered as the module main body in the present invention.

For example, in a case where the thermoelectric conversion module of the present invention has a bellows-like power generation module single body having the same configuration as the configuration of a module main body 84 shown in FIG. 10 which will be described later, and a bellows-like power generation module single body having the same configuration as the configuration of the module main body 11, the bellows-like power generation module single body having the same configuration as the configuration of the module main body 84 may be considered as a module main body in the present invention, the bellows-like power generation module single body having the same configuration as the configuration of the module main body 11 may be considered as a thermoelectric conversion member in the present invention. Reversely, the bellows-like power generation module single body having the same configuration as the configuration of the module main body 11 may be considered as a module main body in the present invention, and the bellows-like power generation module single body having the same configuration as the configuration of the module main body 84 may be considered as a thermoelectric conversion member in the present invention.

The module 70 shown in FIG. 8 has two thermoelectric conversion members 72. However, the present invention is not limited thereto. That is, the thermoelectric conversion module of the present invention may be configured such that two bellows-like power generation module single bodies each having only one thermoelectric conversion member 72 are laminated. In this case, the thermoelectric conversion member 72 may be laminated on the thermoelectric conversion layer side of the module main body 11 or may be laminated on the support 12 side.

Alternatively, four or more bellows-like power generation module single bodies having three or more thermoelectric conversion members 72 may be laminated.

In the module 70 shown in FIG. 8, the module main body 11 and the thermoelectric conversion members 72 have the same configurations. However, the present invention is not limited thereto.

That is, in the present invention, in a configuration in which a thermoelectric conversion member is provided as a bellows-like member, in the module main body and the thermoelectric conversion member, the formation and/or position of the thermoelectric conversion layer, the shape and/or the position of the connection electrode, the kind of the thermoelectric conversion layer (of both P-type and N-type, only P-type, or only N-type), and the like may be different (refer to FIGS. 10 and 11 which will be described later). That is, the module main body and the thermoelectric conversion member may have different configurations. In addition, in a case where a plurality of thermoelectric conversion members are provided, the thermoelectric conversion members may have different configurations.

In this case, the reason that any of bellows-like power generation module single bodies may be considered as a module main body in the present invention is as described above.

However, as shown in a second aspect of the production method of the present invention, which will be described later, from the viewpoint of making bellows-like folding possible in a state in which the module main body 11 and the thermoelectric conversion members 72 are laminated, or the like, in a case where plurality of bellows-like power generation module single bodies are provided, it is preferable that the positions of the mountain folds and the valley folds thereof are matched with each other in all of the bellows-like power generation module single bodies, and it is particularly preferable that all of the bellows-like power generation module single bodies have the same configuration as shown in FIG. 8.

The thermoelectric conversion module of the present invention may have one or more bellows-like thermoelectric conversion members as described above or may have the insulating member 20 and/or the heat dissipation member 42.

Figure 9:
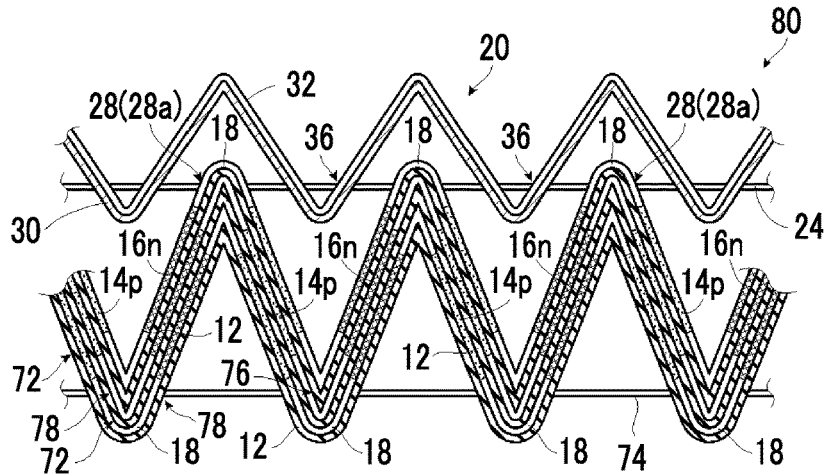
FIG. 9 is a schematic front view showing still another example of the thermoelectric conversion module according to the present invention.

For example, as in a thermoelectric conversion module 80 shown in FIG. 9, the insulating member 20 may be provided in the module 70 shown in FIG. 8 as in the module 10 shown in FIGS. 1A to 1C.

Alternatively, in the module 40 shown in FIG. 4, the thermoelectric conversion module shown in FIG. 5, the thermoelectric conversion module shown in FIG. 6, and the like, one or more thermoelectric conversion members 72 (bellows-like power generation module single bodies which generate power by thermoelectric conversion) may be laminated on the module main body 11.

In addition, in the module 10 shown in FIGS. 1A to 1C, the thermoelectric conversion member 72 may be provided on the insulating member 20.

In addition, in the example shown in FIG. 8, the module main body 11, the thermoelectric conversion member 72, and the thermoelectric conversion member 72 are laminated to face the support 12 and the thermoelectric conversion layer. However, the present invention is not limited thereto.

For example, as shown in FIG. 8, in a case where the module main body 11 and the thermoelectric conversion members 72 have the same configuration, the module main body 11 and the thermoelectric conversion members 72 may be laminated such that the front and back surfaces of the thermoelectric conversion members 72 are reversed and the thermoelectric conversion layers face each other. In other words, as shown in FIG. 8, in a case where the module main body 11 and the thermoelectric conversion members 72 have the same configuration, the module main body 11 and the thermoelectric conversion members 72 may be laminated such that the mountain folds and the valley folds of the support 12 in the dashed lines (refer to FIG. 2) are reversed and the thermoelectric conversion layers face each other.

In this case, in the module main body 11 and the thermoelectric conversion members 72, the P-type thermoelectric conversion layers 14p come into contact with each other and the N-type thermoelectric conversion layers 16n come into contact with each other. Therefore, even in a case where the module main body 11 and the thermoelectric conversion members 72 are laminated to face the thermoelectric conversion layers, a short circuit does not occur.

In the above example, the module main body 11 is configured such that the P-type thermoelectric conversion layers 14p and the N-type thermoelectric conversion layers 16n are alternately provided on each sloped surface of one surface of the bellows-like folded support 12, and the adjacent P-type thermoelectric conversion layer 14p and N-type thermoelectric conversion layer 16n are connected by the connection electrode 18 over adjacent sloped surfaces. However, the present invention is not limited thereto and various configurations can be used.

For example, in the module main body (thermoelectric conversion member), the P-type thermoelectric conversion layer 14p and the N-type thermoelectric conversion layer 16n which are separated from each other may be provided on one sloped surface of the bellows-like folded support 12.

FIG. 10 shows an example thereof.

In the module main body 84 shown in FIG. 10, a large number of members which are the same as the members in the above-described module main body 11 shown in FIG. 2 or the like are used. Thus, the same reference numerals are attached to the same members and different portions are mainly described below. Regarding this point, the same applies to a module main body 95 shown in FIG. 11.

In addition, these module main bodies can be used as thermoelectric conversion members.

FIG. 10 is a conceptual view in which the module main body 84 is spread in a plane shape as in FIG. 2. In FIG. 10, the support 12 is alternately mountain-folded and valley-folded along the dashed line. That is, a space between the dashed lines becomes a sloped surface of the bellows-like folded support 12.

The module main body 84 shown in FIG. 10 alternately has a sloped surface having a P-type thermoelectric conversion layer 86p, an N-type thermoelectric conversion layer 90n, and a P-type thermoelectric conversion layer 86p, which are separated from each other, and a sloped surface having an N-type thermoelectric conversion layer 90n, a P-type thermoelectric conversion layer 86p, and an N-type thermoelectric conversion layer 90n, which are separated from each other, in a longitudinal direction.

On the sloped surface having the P-type thermoelectric conversion layer 86p, the N-type thermoelectric conversion layer 90n, and the P-type thermoelectric conversion layer 86p, the thermoelectric conversion layers are arranged so as to sandwich the N-type thermoelectric conversion layer 90n between the two P-type thermoelectric conversion layers 86p in a width direction.

On the sloped surface, the P-type thermoelectric conversion layer 86p, the N-type thermoelectric conversion layer 90n, and the P-type thermoelectric conversion layer 86p are connected in series by two connection electrodes 94. Each connection electrode 94 connects one P-type thermoelectric conversion layer 86p and the N-type thermoelectric conversion layer 90n so as to sandwich the N-type thermoelectric conversion layer 90n therebetween in the longitudinal direction and connects the N-type thermoelectric conversion layer 90n and the other P-type thermoelectric conversion layer 86p.

On the other hand, on the sloped surface having the N-type thermoelectric conversion layer 90n, the P-type thermoelectric conversion layer 86p, and the N-type thermoelectric conversion layer 90n, the thermoelectric conversion layers are arranged so as to sandwich the P-type thermoelectric conversion layer 86p between the two N-type thermoelectric conversion layers 90n in the width direction.

On the sloped surface, the N-type thermoelectric conversion layer 90n, the P-type thermoelectric conversion layer 86p, and the N-type thermoelectric conversion layer 90n are connected in series by two connection electrodes 94. Each connection electrode 94 connects one N-type thermoelectric conversion layer 90n and the P-type thermoelectric conversion layer 86p so as to sandwich the P-type thermoelectric conversion layer 86p therebetween in the longitudinal direction and connects the P-type thermoelectric conversion layer 86p and the other N-type thermoelectric conversion layer 90n.

On adjacent sloped surfaces, in one end portion in the width direction, the N-type thermoelectric conversion layer 90n and the P-type thermoelectric conversion layer 86p are connected by a connection electrode 92 over a ridge line of the sloped surface. The connection between the N-type thermoelectric conversion layer 90n and the P-type thermoelectric conversion layer 86p by the connection electrode 92 on the adjacent sloped surfaces is alternately performed in the end portions of the thermoelectric conversion layers in the width direction.

Thus, all of the P-type thermoelectric conversion layers 86p and the N-type thermoelectric conversion layers 90n formed on the support 12 are alternately connected in series.

In the above example, as a preferable embodiment, the module main body has both the N-type thermoelectric conversion layer and the P-type thermoelectric conversion layer. However, the present invention is not limited thereto. The module main body (thermoelectric conversion member) may have only the N-type thermoelectric conversion layer or the P-type thermoelectric conversion layer.

FIG. 11 shows an example thereof.

FIG. 11 is also a conceptual view in which the module main body is spread in a plane shape as in FIG. 2. In FIG. 11, the support 12 is alternately mountain-folded and valley-folded along the dashed line.

The module main body 95 shown in FIG. 11 alternately has a sloped surface having two P-type thermoelectric conversion layers 86p in the vicinities of end portions in a width direction and a sloped surface having one P-type thermoelectric conversion layer 86p at the center in a width direction in a longitudinal direction.

On the sloped surface having the two P-type thermoelectric conversion layers 86p in the vicinity of the end portion in the width direction, the two P-type thermoelectric conversion layers 86p are connected by a connection electrode 96. The connection of the P-type thermoelectric conversion layers 86p by the connection electrode 96 is performed in the opposite end portion of the two P-type thermoelectric conversion layers 86p in the longitudinal direction.

On the sloped surface, the connection electrode 18 is connected to the two P-type thermoelectric conversion layers 86p over a ridge line of the sloped surface. The connection electrode 18 connected to each P-type thermoelectric conversion layer 86p reaches different sloped surfaces.

On the sloped surface having one P-type thermoelectric conversion layer 86p at the center in the width direction, the two connection electrodes 98 are connected to the P-type thermoelectric conversion layer 86p while sandwiching the P-type thermoelectric conversion layer 86p therebetween in the longitudinal direction.

On the other hand, the connection electrode 98 is connected to the connection electrode 18 over the ridge line of one sloped surface side. The other connection electrode 98 is connected to the connection electrode 18 over the ridge line of the opposite sloped surface side in the longitudinal direction.

Thus, a large number of P-type thermoelectric conversion layers 86p formed on the support 12 are connected in series.

In the above example, the module main body has the thermoelectric conversion layers on only one surface of the support. However, the present invention is not limited thereto. That is, in the thermoelectric conversion module of the present invention, the module main body (thermoelectric conversion member) may have the thermoelectric conversion layers on both surfaces of the support.

Further, in the thermoelectric conversion module of the present invention, in a case where a thermoelectric conversion member is provided and the thermoelectric conversion layer of the module main body and the thermoelectric conversion layer of the thermoelectric conversion member are laminated to face each other, or in a case where the thermoelectric conversion layers of thermoelectric conversion members are laminated to face each other, a bellows-like insulating member formed of only an insulating material may be provided between the module main body and the thermoelectric conversion layer, or the module main body and/or the thermoelectric conversion layer of the thermoelectric conversion member may be covered by an insulating coating film.

Figure 12:
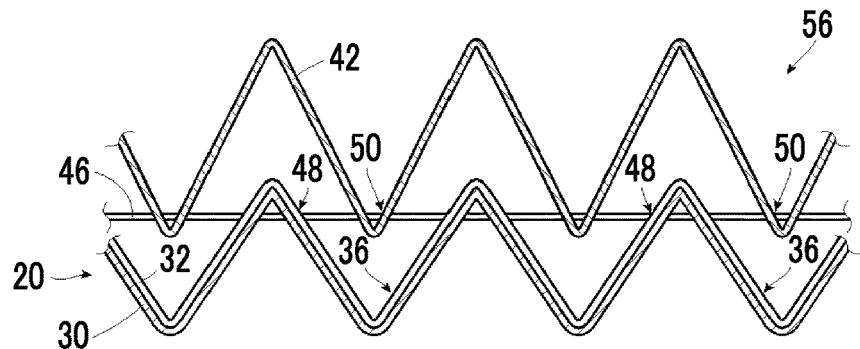
FIG. 12 is a schematic front view showing an example of a heat conductive laminate according to the present invention.

FIG. 12 conceptually shows an example of a heat conductive laminate of the present invention.

A heat conductive laminate 56 shown in FIG. 12 is configured such that the above-described insulating member 20 and heat dissipation member 42 are laminated such that the concave and convex portions of the bellows thereof are fitted to each other, and the wire 46 penetrates the through-holes of the insulating member 20 and the through-holes 50 of the heat dissipation member 42 so as to be inserted through the insulating member 20 and the heat dissipation member 42.

That is, the heat conductive laminate 56 is obtained by removing the module main body 11 from the module 10 shown in FIG. 4A. In other words, the module 10 shown in FIG. 4A is obtained by combining the heat conductive laminate 56 shown in FIG. 12 with the module main body 11 such that the concave and convex portions thereof are fitted to each other.

As described above, as a preferable embodiment, the insulating member 20 has a configuration in which the heat conductive layer 32 is formed on one surface of the support 30.

However, as in the above-described module 10, the heat conductive laminate 56 of the present invention is not limited thereto and the insulating member 20 may be configured by only folding a sheet-like material having insulating properties, such as a resin film, in a bellows-like shape.

Hereinafter, referring to the conceptual views shown in FIGS. 13 to 16B, the first aspect of a method of producing the module 10 shown in FIG. 1A or the like will be described and a method of producing a thermoelectric conversion module and a method of producing a heat conductive laminate of the present invention will be described.

Figure 13:
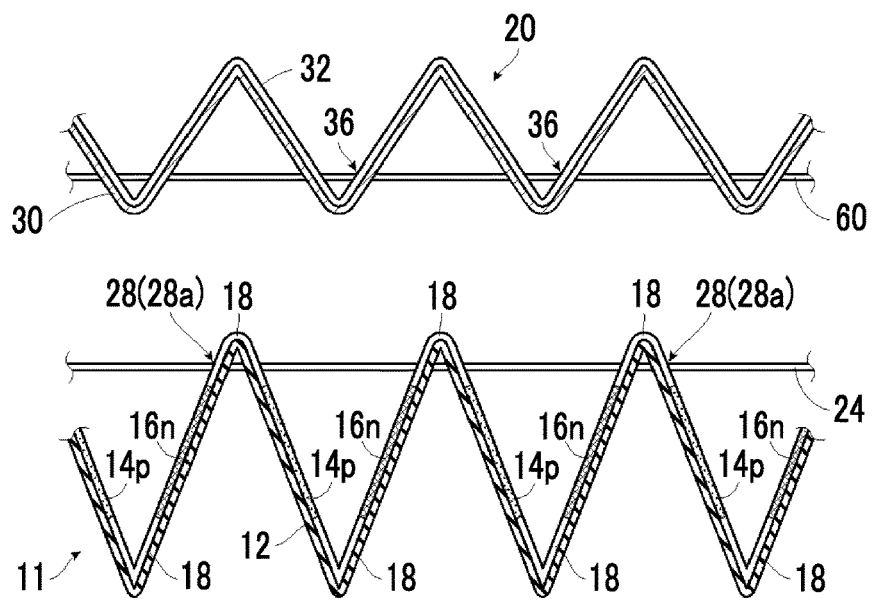
FIG. 13 is a schematic front view for illustrating an example of a first aspect of a method of producing a thermoelectric conversion module according to the present invention.

First, as shown in FIG. 13, a long bellows-like module main body 11 into which the wire 24 penetrates the through-holes 28 formed on the bellows-like folded sloped surfaces, and a long bellows-like insulating member 20 into which a wire 60 penetrates the through-holes 36 formed on the bellows-like folded sloped surfaces are prepared.

Figure 14:
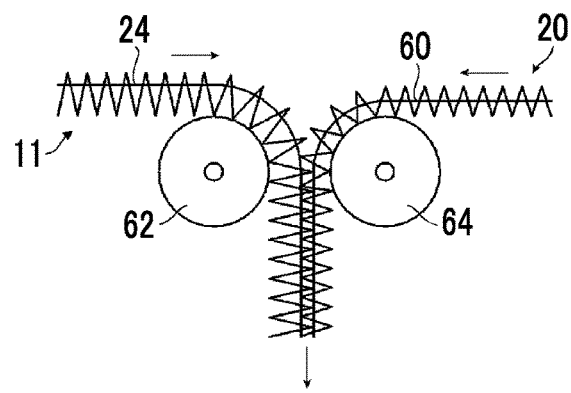
FIG. 14 is a conceptual view for illustrating the example of the first aspect of the method of producing a thermoelectric conversion module according to the present invention.

Next, as shown in FIG. 14, while the module main body 11 into which the wire 24 is inserted and the insulating member 20 into which the wire 60 is inserted are transported in the longitudinal direction, the transport path of the module main body 11 is bent at 90° by a roller 62 and similarly, the transport path of the insulating member 20 is bent at 90° by a roller 64.

The module main body 11 and the insulating member 20 are transported at the time when the transport paths thereof are bent by the rollers 62 and 64, such that a surface of the module main body 11 where the thermoelectric conversion layer is formed faces the support 30 of the insulating member 20.

Figure 15A:
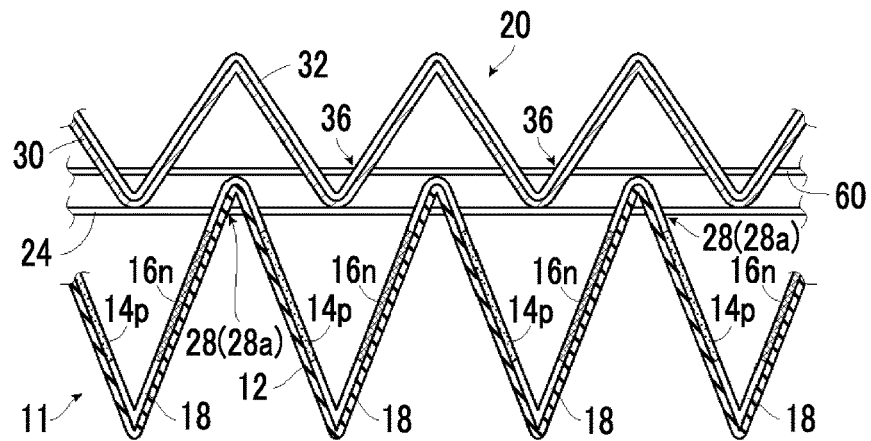
FIG. 15A is a schematic front view for illustrating the example of the first aspect of the method of producing a thermoelectric conversion module according to the present invention.

At locations where the module main body 11 and the insulating member 20 are bent at 90°, that is, at locations where the transport paths are changed, as shown in FIGS. 14 and 15A, the module main body 11 and the insulating member 20 are laminated such that the concave and convex portions thereof are fitted to each other.

In the present invention, while transporting the long bellows-like module main body 11 and insulating member 20 in the longitudinal direction, at least one of the transport paths is changed and at the transport path changing point, the module main body 11 and the insulating member 20 are laminated. Then, both the module main body 11 and the insulating member 20 can be easily laminated such that the concave and convex portions thereof are fitted to each other.

In addition, since the module main body 11 and the insulating member 20 are transported in a state in which the wire 24 is inserted through the module main body and the wire 60 is inserted through the insulating member 20, even in a case where the module main body 11 and the insulating member are transported in the longitudinal direction and the transport paths are changed or laminated, a proper bellows-like shape can be maintained. Therefore, it is possible to stably laminate the module main body 11 and the insulating member 20 such that the concave and convex portions thereof are fitted to each other.

In the example shown in the drawing, the transport paths of the module main body 11 and the insulating member 20 are changed by the cylindrical rollers 62 and 64. However, the present invention is not limited thereto. For example, by using rollers or gears having concave and convex portions according to the bellows of the module main body 11 and concave and convex portions according to the bellows of the insulating member 20, the transport paths of the module main body 11 and the insulating member 20 to be transported in the longitudinal direction may be changed.

In addition, one of transport paths of the module main body 11 and the insulating member 20 may be changed to laminate the module main body 11 and the insulating member 20 while fitting the concave and convex portions thereof to each other.

Figure 15B:
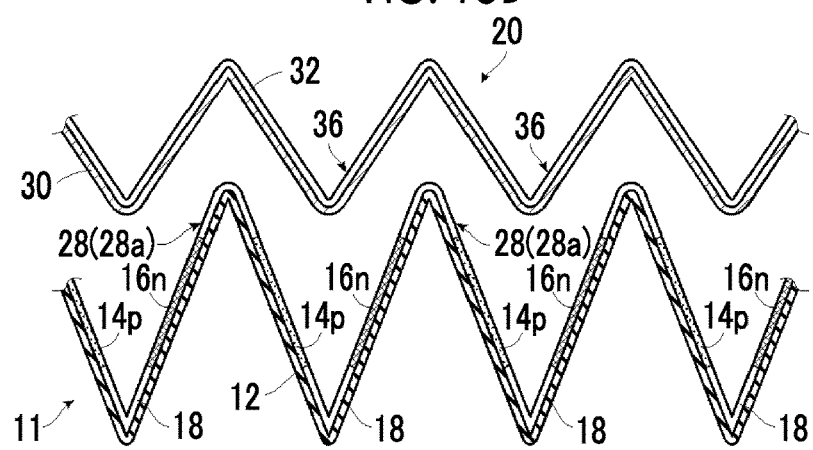
FIG. 15B is a schematic front view for illustrating the example of the first aspect of the method of producing a thermoelectric conversion module according to the present invention.

As shown in FIGS. 14 and 15A, after the module main body 11 and the insulating member 20 are laminated while fitting the concave and convex portions thereof to each other, as shown in FIG. 15B, the wire 24 is drawn out from the module main body 11 and the wire 60 is drawn out from the insulating member 20, respectively.

Figure 16A:
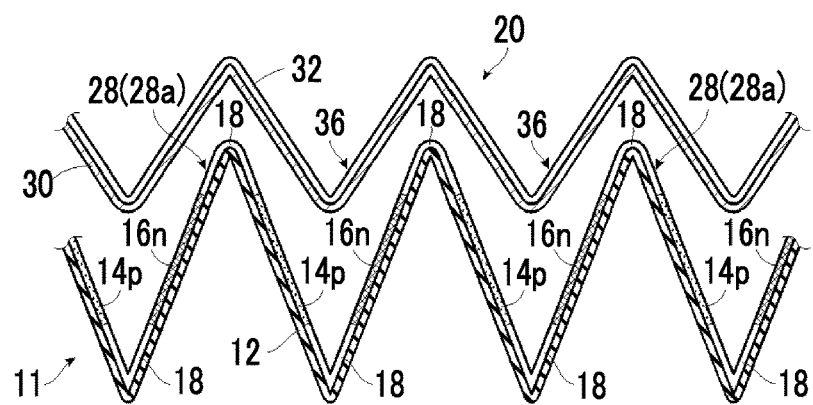
FIG. 16A is a schematic front view for illustrating the example of the first aspect of the method of producing a thermoelectric conversion module according to the present invention.

Next, as shown in FIG. 16A, the module main body 11 and the insulating member 20 are aligned. In the example, the module main body 11 and the insulating member 20 are aligned such that the through-holes 28 of the module main body 11 and the through-holes of the insulating member 20 are linearly arranged.

Figure 16B:
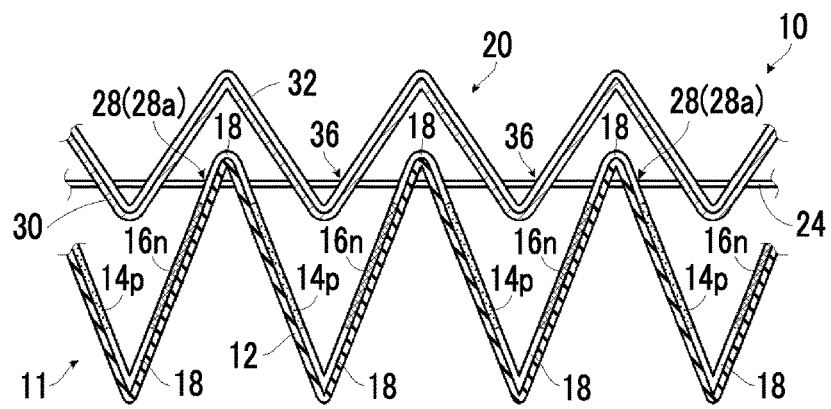
FIG. 16B is a schematic front view for illustrating the example of the first aspect of the method of producing a thermoelectric conversion module according to the present invention.

Further, as shown in FIG. 16B, the wire 24 drawn out from the module main body 11 is inserted such that the wire penetrates the through-holes 28 of the module main body 11 and the through-holes of the insulating member 20. Thus, the concave and convex portions of the bellows thereof are fitted to each other and the wire 24 is inserted through the module main body and the insulating member to form the module 10 of the present invention.

Accordingly, in the example, the wire 24 drawn out from the module main body 11 is a linear fixing member. As the linear fixing member, the wire 60 drawn out from the insulating member 20 may of course be used.

In the examples shown in FIGS. 13 to 16B, after the module main body 11 and the insulating member 20 are laminated, the wire 24 and the wire 60 are drawn out and alignment is performed. Then, the wire 24 is inserted through the module main body and the insulating member again.

In contrast, in another example of the first aspect of the method of producing a thermoelectric conversion module of the present invention, in a state in which the wire 24 and the wire 60 are not drawn out and are left as they are, another wire is inserted through the module main body 11 and the insulating member 20.

That is, in the method, as shown in FIG. 15A, in a state in which the module main body 11 and the insulating member 20 are laminated, if necessary, the module main body and the insulating member are aligned and the wire 24 and the wire 60 are not drawn out and are left as they are. In this state, a wire which is a different linear fixing member from the wire 24 and the wire 60 is inserted through the module main body 11 and the insulating member 20.

In this case, the through-holes that the wire which becomes a linear fixing member penetrates are formed at predetermined positions on the sloped surfaces of the module main body 11 and the insulating member 20 in advance. Alternatively, the wire which becomes a linear fixing member may be caused to penetrate the sloped surfaces of the module main body 11 and the insulating member 20 to form through-holes.

The above description is related to the method of producing the module shown in FIG. 1A, but the thermoelectric conversion modules shown in FIGS. 4A to 6 can be produced by repeating the same operation using the bellows-like heat dissipation member 42 into which the linear member is inserted.

In addition, the heat conductive laminate 56 shown in FIG. 12 can be produced in the same manner using the bellows-like insulating member 20 into which the linear member is inserted and the bellows-like heat dissipation member 42 into which the linear member is inserted.

In addition, the module 40 shown in FIG. 4A may be prepared in the same manner using the heat conductive laminate 56 shown in FIG. 12 and the module main body 11 into which the wire 24 is inserted shown in FIG. 13. In this case, a wire may be separately inserted at positions corresponding to the through-holes 36 of the insulating member 20.

Further, in the production method of the present invention, by considering one or more module main bodies different from the module main body 11 as bellows-like members, a thermoelectric conversion module in which the module main body 11 is laminated can be produced.

Figure 17A:
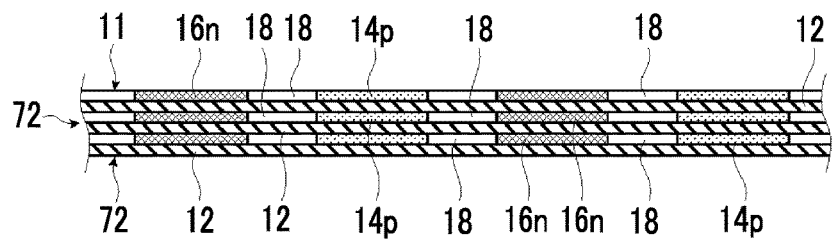
FIG. 17A is a schematic front view for illustrating an example of a second aspect of the method of producing a thermoelectric conversion module according to the present invention.
Figure 17B:
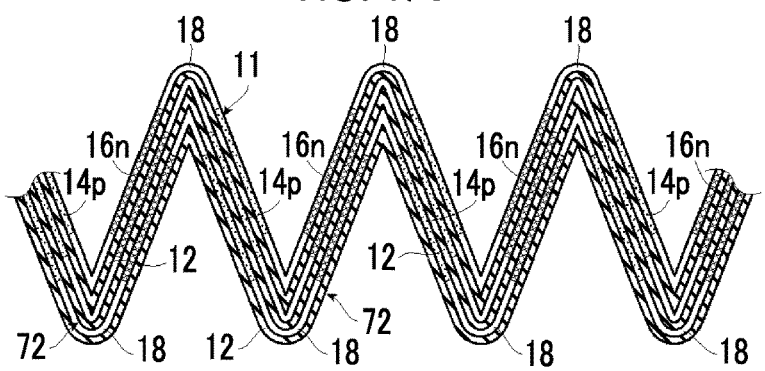
FIG. 17B is a schematic front view for illustrating the example of the second aspect of the method of producing a thermoelectric conversion module according to the present invention.
Figure 17C:
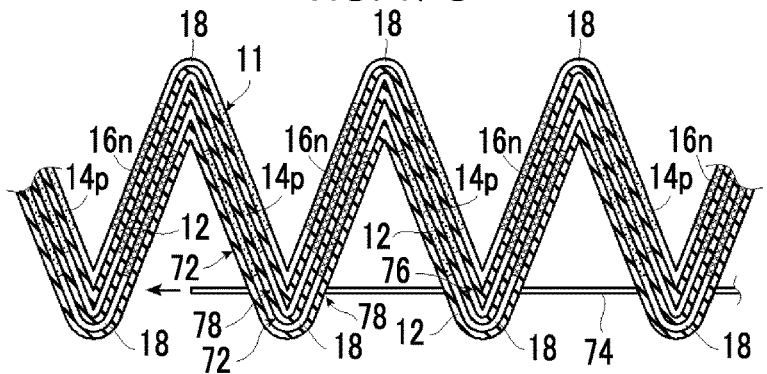
FIG. 17C is a schematic front view for illustrating the example of the second aspect of the method of producing a thermoelectric conversion module according to the present invention.

FIGS. 17A to 17C conceptually show an example of a second aspect of the method of producing a thermoelectric conversion module of the present invention.

The production method shown in FIGS. 17A to 17C is, for example, a method of producing the module 70 shown in FIG. 8. That is, the second aspect of the production method of the present invention is a suitable method of producing a thermoelectric conversion module having a configuration in which a plurality of bellows-like power generation module single bodies having the same configuration are laminated as shown in FIG. 8.

First, as shown in FIG. 17A, a laminate in which the module main body 11 before the module main body is folded in a bellows-like shape and the thermoelectric conversion members 72 before the thermoelectric conversion members are folded in a bellows-like shape are laminated is prepared.

FIGS. 17A to 17C show the method of producing the module 70 shown in FIG. 8. Accordingly, in addition to the module main body 11, two thermoelectric conversion members 72 are provided, a second plate-like thermoelectric conversion member 72 is laminated on a first plate-like thermoelectric conversion member 72, and the plate-like module main body 11 is laminated on the second plate-like thermoelectric conversion member 72.

Next, as shown in FIG. 17B, the laminate is folded in a bellows-like shape.

A method of folding the laminate in a bellows-like shape, various known methods of folding a sheet-like material and a laminate of a sheet-like material in a bellows-like shape such as a method of inserting the laminate through a space between gears engaged with each other can be used.

Finally, as shown in FIG. 17C, the wire 74 penetrates the sloped surfaces of the thermoelectric conversion member 72, the thermoelectric conversion member 72, and the module main body 11 which are folded in a bellows-like shape and is inserted through the thermoelectric conversion member 72, the thermoelectric conversion member 72, and the module main body 11 to form the module 70 shown in FIG. 8.

The through-holes 76 of the module main body 11 and the through-holes 78 of the thermoelectric conversion member 72 that the wire 74 penetrates may be formed in a state before the laminate is folded in a bellows-like shape shown in FIG. 17A or may be formed in a stage in which the laminate is folded in a bellows-like shape shown in FIG. 17B. Alternatively, after the laminate is folded in a bellows-like shape, the through-holes 76 and the through-holes 78 may be formed by inserting the wire 74 through the laminate.

In addition, the module 80 having the insulating member 20 or the like as shown in FIG. 9 can be prepared by implementing the first aspect of the production method of the present invention after preparing the module 70 as described above, as shown in FIGS. 13 to 16B.

The thermoelectric conversion module, the heat conductive laminate, the method of producing a thermoelectric conversion module, and the method of producing a heat conductive laminate of the present invention have been described above. However, the present invention is not limited to the above examples. Various improvements and modifications may of course be made without departing from the spirit of the present invention.

The present invention can be suitably used for a powe neration device and production thereof, and the like.

EXPLANATION OF REFERENCES 10, 40, 70, 80 (thermoelectric conversion) module
11, 84, 95: module main body
12, 30: support
14p, 86p: P-type thermoelectric conversion layer
16n, 90n: N-type thermoelectric conversion layer
18, 92, 94, 96, 98: connection electrode
20: insulating member
24, 46, 52, 60, 74: wire
28, 36, 48, 50, 76, 78: through-hole
32: heat conductive layer
42: heat dissipation member
62, 64: roller

What is claimed is:

1. A thermoelectric conversion module comprising:
a module main body having a support which is folded in a bellows-like shape, a plurality of thermoelectric conversion layers which are formed on at least one surface of the support and are separated from each other, and connection electrodes which connect the thermoelectric conversion layers adjacent to each other;
one or more bellows-like members which are provided such that concave and convex portions thereof are fitted to those of the module main body and are folded in a bellows-like shape; and
a flexible linear member which penetrates sloped surfaces of the module main body formed by bellows-like folding and sloped surfaces of at least one of the bellows-like members formed by bellows-like folding so as to be inserted through the module main body and at least one of the bellows-like members.

2. The thermoelectric conversion module according to claim 1,
wherein the bellows-like member is one or more selected from an insulating member, a heat dissipation member, and a thermoelectric conversion member.

3. The thermoelectric conversion module according to claim 2,
wherein the insulating member is provided to face a surface of the module main body on which the thermoelectric conversion layer is formed.

4. The thermoelectric conversion module according to claim 3,
wherein the heat dissipation member is provided to face a surface of the insulating member on a side opposite to the module main body.

5. The thermoelectric conversion module according to claim 4, further comprising:
a second flexible linear member which penetrates sloped surfaces of the insulating member and sloped surfaces of the heat dissipation member so as to be inserted through the insulating member and the heat dissipation member.

6. The thermoelectric conversion module according to claim 2,
wherein the insulating member has a heat conductive layer on a surface of an insulating layer, and the insulating layer is provided to face a surface of the module main body on which the thermoelectric conversion layer is formed.

7. The thermoelectric conversion module according to claim 2,
wherein the thermoelectric conversion member has a member support which is folded in a bellows-like shape, a plurality of member thermoelectric conversion layers which are formed on at least one surface of the member support and are separated from each other, and member connection electrodes which connect the member thermoelectric conversion layers adjacent to each other.

8. The thermoelectric conversion module according to claim 7, wherein the module main body has the thermoelectric conversion layers on only one surface of the support and the thermoelectric conversion member has the member thermoelectric conversion layers on only one surface of the member support, and at least one of a thermoelectric conversion member which is provided to face the member support or a thermoelectric conversion member which is provided to face the member thermoelectric conversion layer is provided on the thermoelectric conversion layer of the module main body or on the support of the module main body.

9. The thermoelectric conversion module according to claim 8, wherein a plurality of the thermoelectric conversion members are provided, and one or more combinations of the thermoelectric conversion members which are provided to face the member support and the member thermoelectric conversion layer are provided.

10. The thermoelectric conversion module according to claim 1, wherein the linear member penetrates locations other than positions where the thermoelectric conversion layers are formed and positions where the connection electrodes are formed in the module main body.

11. The thermoelectric conversion module according to claim 10, wherein the linear member penetrates the connection electrodes at the same position in a slope direction of the sloped surface and on an outer side of a ridge line in a longitudinal direction.

12. The thermoelectric conversion module according to claim 1, wherein the thermoelectric conversion layers of the module main body are P-type thermoelectric conversion layers and N-type thermoelectric conversion layers which are alternately provided on each sloped surface of one surface of the support.

13. A heat conductive laminate comprising:

an insulating member which is folded in a bellows-like shape;

a heat dissipation member which is folded in a bellows-like shape and is provided such that concave and convex portions thereof are fitted to those of the insulating member; and a flexible linear member which penetrates sloped surfaces of the insulating member formed by bellows-like folding, sloped surfaces of the heat dissipation member formed by bellows-like folding so as to be inserted through the insulating member and the heat dissipation member.

14. The heat conductive laminate according to claim 13, wherein the insulating member has a heat conductive layer on a surface of an insulating layer.

15. A method of producing a thermoelectric conversion module comprising:

a step of laminating a plurality of sheet-like materials each having a support, a plurality of thermoelectric conversion layers which are formed on at least one surface of the support and are separated from each other, and connection electrodes which connect the thermoelectric conversion layers adjacent to each other;

a step of folding a laminate of the sheet-like materials in a bellows-like shape; and a step of causing a flexible linear member to penetrate sloped surfaces of the bellows-like folded sheet-like material formed by bellows-like folding so as to be inserted through the sheet-like material.

* * * * *